(12) United States Patent
Myung et al.

(10) Patent No.: US 8,907,409 B2
(45) Date of Patent: Dec. 9, 2014

(54) SEMICONDUCTOR DEVICE HAVING BURIED BIT LINES AND METHOD FOR FABRICATING THE SAME

(71) Applicant: SK Hynix Inc., Gyeonggi-do (KR)

(72) Inventors: Ju-Hyun Myung, Gyeonggi-do (KR);
Eui-Seong Hwang, Gyeonggi-do (KR);
Eun-Shil Park, Gyeonggi-do (KR);
Tae-Yoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 20 days.

(21) Appl. No.: 13/800,821

(22) Filed: Mar. 13, 2013

(65) Prior Publication Data

US 2014/0061778 A1    Mar. 6, 2014

(30) Foreign Application Priority Data

Aug. 28, 2012 (KR) .................. 10-2012-0094328

(51) Int. Cl.
*H01L 29/78* (2006.01)
*H01L 27/108* (2006.01)
*H01L 29/417* (2006.01)
*H01L 29/66* (2006.01)
*H01L 21/223* (2006.01)
*H01L 29/165* (2006.01)

(52) U.S. Cl.
CPC ......... *H01L 29/7827* (2013.01); *H01L 21/2236* (2013.01); *H01L 27/10876* (2013.01); *H01L 29/165* (2013.01); *H01L 27/10885* (2013.01); *H01L 29/41741* (2013.01); *H01L 29/66666* (2013.01)
USPC ..... 257/329; 257/328; 257/301; 257/E29.262

(58) Field of Classification Search
CPC .................. H01L 27/10876; H01L 27/10885; H01L 27/10823; H01L 29/66666; H01L 29/7827
USPC ........... 257/329, 334, 616, 301, 392, E29.262
See application file for complete search history.

(56) References Cited

U.S. PATENT DOCUMENTS

| 7,736,969 | B2 | 6/2010 | Abbott et al. | |
|---|---|---|---|---|
| 2006/0087005 | A1* | 4/2006 | Herner | 257/616 |
| 2006/0246720 | A1 | 11/2006 | Wu et al. | |
| 2010/0163968 | A1* | 7/2010 | Kim et al. | 257/324 |
| 2010/0308466 | A1 | 12/2010 | Takesako | |
| 2011/0223725 | A1* | 9/2011 | Kang et al. | 438/151 |
| 2012/0018801 | A1* | 1/2012 | Kobayashi et al. | 257/334 |
| 2012/0181606 | A1* | 7/2012 | Nagai | 257/334 |

FOREIGN PATENT DOCUMENTS

KR    1020130065264    6/2013

* cited by examiner

*Primary Examiner* — Tom Thomas
*Assistant Examiner* — John Bodnar
(74) *Attorney, Agent, or Firm* — IP & T Group LLP

(57) ABSTRACT

A semiconductor device includes semiconductor bodies formed substantially perpendicular to a semiconductor substrate, buried bit lines formed in the semiconductor bodies and including a metal silicide; and barrier layers formed under and over the buried bit lines and containing germanium.

5 Claims, 18 Drawing Sheets

SEMICONDUCTOR DEVICE HAVING BURIED BIT LINES AND METHOD FOR FABRICATING THE SAME

CROSS-REFERENCE TO RELATED APPLICATIONS

The present application claims priority of Korean Patent Application No. 10-2012-0094328, filed on Aug. 28, 2012, which is incorporated herein by reference in its entirety.

BACKGROUND

1. Field

Exemplary embodiments of the present invention relate to a semiconductor device fabrication technology, and more particularly, to a semiconductor device having buried bit lines and a method for fabricating the same.

2. Description of the Related Art

Most semiconductor devices include transistors. For example, a semiconductor memory device represented by a DRAM includes a memory cell having a MOSFET. In general, in a MOSFET, since source/drain regions are formed in the surface of a semiconductor substrate, a planar channel is formed between the source region and the drain region. Such a general MOSFET is thus referred to as a planar channel transistor.

As improvements in degree of integration and performance are continuously demanded for a semiconductor memory device, a technology for fabricating a MOSFET is reaching physical limitations. For example, as the size of a memory cell shrinks, the size of a MOSFET shrinks, which causes the channel length of the MOSFET to be shortened. If the channel length of a MOSFET is shortened, data maintaining properties are likely to deteriorate, whereby the characteristics of the memory device may be degraded.

In consideration of these concerns, a vertical channel transistor (VCT) has been suggested in the art. In the vertical channel transistor, junction regions are formed at the respective ends of a pillar, and any one of the junction regions is connected with a bit line. The bit line is buried in a trench defined between pillars, thus it is referred to as a buried bit line (BBL).

Two adjacent memory cells each including a vertical channel transistor (VCT) and a buried bit line (BBL) are adjacent to one buried bit line (BBL). Therefore, the buried bit line (BBL) is formed in a space (for example, a trench) between two adjacent memory cells, and an OSC (one-side-contact) process is performed to connect one memory cell with one buried bit line (BBL). The OSC process is a process for allowing each buried bit line (BBL) to be brought into contact with any one of two adjacent memory cells. Thus, the OSC process is also referred to as a single-side-contact (SSC) process. Generally, in a memory device that adopts a planar channel transistor, in order to connect a planar channel transistor with a bit line, a contact plug process with a high aspect ratio is required. In contrast, in the case of adopting a vertical channel transistor and a buried bit line, since the vertical channel transistor and the buried bit line may be brought into direct contact with each other, a contact plug process is not required. Therefore, the parasitic capacitance of the bit line may be reduced.

FIG. 1 is a cross-sectional view illustrating buried bit lines according to the conventional art.

Referring to FIG. 1, a plurality of semiconductor bodies 14, which are separated by trenches 13, are formed on a semiconductor substrate 11. The semiconductor bodies 14 are formed through an etching process for the semiconductor substrate 11, using hard mask patterns 12. A passivation layer 15 is formed on the sidewalls of the semiconductor bodies 14 and on the surfaces of the trenches 13. Open parts 17 are defined in the passivation layer 15 through an OSC process. Each open part 17 opens a sidewall of each semiconductor body 14. Buried bit lines 16 are formed in the trenches 13. The buried bit lines 16 are connected with the semiconductor bodies 14 through the open parts 17. Each buried bit line 16 is connected with one of two adjacent semiconductor bodies 14. While not shown in the drawing, the upper portion of each semiconductor body 14 includes a pillar in which source/drain regions and a channel of a vertical channel transistor are formed.

As can be seen from FIG. 1, in order to connect each buried bit line 16 to the sidewall of one of the adjacent semiconductor bodies 14, an OSC process is adopted. In order to realize the OSC process, various methods, such as a liner layer and a tilt ion implantation process, an OSC mask process and the like, have been proposed.

However, these methods fail to form a uniform and reproducible OSC structure due to difficulties in processing. Also, as high integration further proceeds, the distance between adjacent buried bit lines 16 becomes narrow and parasitic capacitance $C_B$ between adjacent buried bit lines 16 increases. Since the buried bit lines 16 are brought into contact with the semiconductor bodies 14, the parasitic capacitance $C_B$ between buried bit lines 16 is substantially the same as the capacitance between the semiconductor body 14 and the buried bit line 16. Because the distance between adjacent buried bit lines 16 becomes narrow, the parasitic capacitance $C_B$, increases markedly.

If the parasitic capacitance $C_B$ between buried bit lines increases in this manner, the operation of a device may become impossible.

SUMMARY

Various exemplary embodiments of the present invention are directed to a semiconductor device having buried bit lines that may reduce the parasitic capacitance between adjacent buried bit lines, and a method for fabricating the same.

In an exemplary embodiment of the present invention, a semiconductor structure may include buried conductors formed in vertical structures and including a metal silicide, and a barrier layer contacting with the metal silicide and containing germanium (Ge).

In another exemplary embodiment of the present invention, a semiconductor device may include semiconductor bodies formed substantially perpendicular to a semiconductor substrate, buried bit lines formed in the semiconductor bodies and including a metal silicide, and barrier layers formed under and over the buried bit lines and containing germanium.

In still another exemplary embodiment of the present invention, a method for fabricating a semiconductor device may include forming semiconductor bodies in which a first barrier layer, a silicon layer and a second barrier layer are stacked substantially perpendicular to a semiconductor substrate, and forming buried bit lines by silicidating the silicon layer.

The first barrier layer and the second barrier layer may include silicon germanium. A content of germanium in the first barrier layer and a content of germanium in the second barrier layer, respectively, may be at least approximately 30%. The forming of the semiconductor bodies may include forming a stack layer in which the first barrier layer, the silicon layer and the second barrier layer are sequentially stacked, over the semiconductor substrate, and selectively etching the stack layer, thereby defining trenches and forming the semiconductor bodies with both sidewalls, which are separated from one another by the trenches. The first barrier layer, the silicon layer and the second barrier layer may be formed through epitaxial growth. The forming of the buried bit lines may include forming a passivation layer that covers sidewalls of the semiconductor bodies, to expose sidewalls of the silicon layer, forming a metal-containing layer over entire surfaces of the semiconductor bodies including the passivation layer, forming a metal silicide layer by reacting the silicon layer and the metal-containing layer with each other through annealing, and removing the portion of the metal-containing layer, which is not reacted. The buried bit lines may include a cobalt silicide.

In still another embodiment of the present invention, a method for fabricating a semiconductor device may include forming a stack layer in which a first germanium-containing layer, a first silicon layer, a second germanium-containing layer and a second silicon layer are sequentially stacked, over a silicon substrate, selectively etching the stack layer, thereby defining trenches and forming semiconductor bodies with both sidewalls, which are separated from one another by the trenches, forming a passivation layer that covers sidewalls of the semiconductor bodies, to expose sidewalls of the first silicon layer, forming buried bit lines by silicidating the first silicon layer, and etching the second silicon layer, thereby forming a plurality of semiconductor pillars that includes channel regions of vertical channel transistors.

The method may further include forming storages that are connected with the plurality of semiconductor pillars. The first germanium-containing layer and the second germanium-containing layer may include of silicon germanium. A content of germanium in the first germanium-containing layer and a content of germanium in the second germanium-containing layer, respectively, may be at least approximately 30%. The first germanium-containing layer, the first silicon layer, the second germanium-containing layer and the second silicon layer are formed through epitaxial growth. The forming of the passivation layer may include forming a first passivation layer along surfaces of structures including the semiconductor bodies, forming a sacrificial layer to fill lower portions of the trenches, forming a second passivation layer on both sidewalls of the semiconductor bodies including the first passivation layer, recessing the sacrificial layer by a predetermined thickness, thereby exposing a portion of the first passivation layer formed on sidewalls of the first silicon layer, and removing the exposed portion of the first passivation layer. The sacrificial layer that fills the lower portions of the trenches may be formed so that an upper surface of the sacrificial layer is positioned between an upper surface and a lower surface of the second germanium-containing layer. The sacrificial layer that is recessed may be formed so that an upper surface of the sacrificial layer is positioned between an upper surface and a lower surface of the first germanium-containing layer. The forming of the buried bit lines may includes forming a metal-containing layer on surfaces of the semiconductor bodies including the passivation layer, forming a metal silicide layer by reacting the metal-containing layer with the first silicon layer through annealing, and removing the portion of metal-containing layer, which has not reacted. The buried bit lines may include a cobalt silicide.

DETAILED DESCRIPTION

Figure 1:
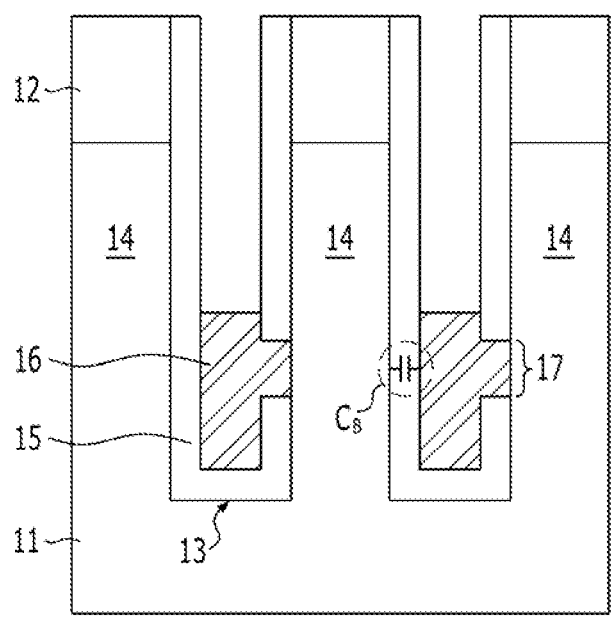
FIG. 1 is a cross-sectional view illustrating conventional buried bit lines.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

The drawings are not necessarily to scale and in some instances, proportions may have been exaggerated in order to clearly illustrate features of the embodiments. It should be readily understood that the meaning of "on" and "over" in the present disclosure should be interpreted in the broadest manner so that "on" means not only "directly on" but also "on" something with an intermediate feature(s) or a layer(s) therebetween, and that "over" means not only directly on top but also on top of something with an intermediate feature(s) or a layer(s) therebetween.

In various embodiments of the present invention that will be described below, in order to reduce parasitic capacitance ($C_B$) between adjacent buried bit lines (BBL), buried bit lines are not formed in the spaces (for example, trenches) between semiconductor bodies, but are formed in the semiconductor bodies. In order to form the buried bit lines in the semiconductor bodies, a BSC (both-side-contact) process is used. For reference, the BSC process is also referred to as a DSC (double-side-contact) process.

A method for fabricating buried bit lines using a BSC process will be described below with reference to FIGS. 2A to 2E. FIGS. 2A to 2E are cross-sectional views illustrating the method for fabricating buried bit lines using a BSC process.

Figure 2A:
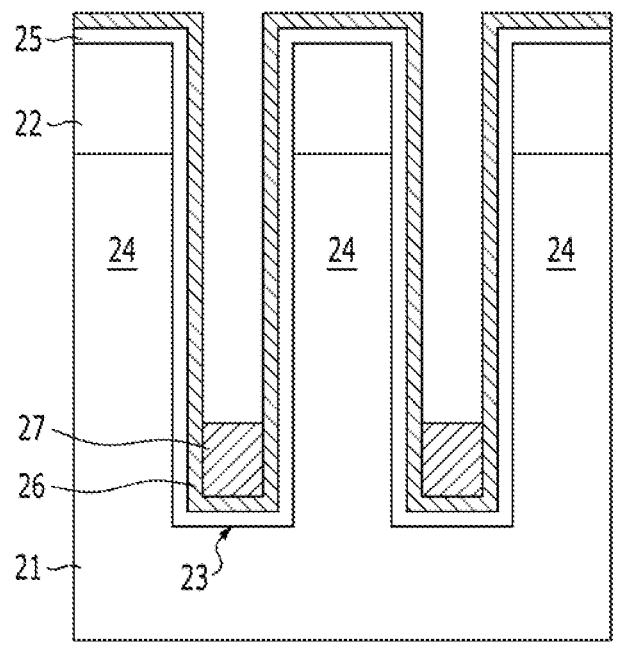
FIGS. 2A to 2E are cross-sectional views illustrating a method for fabricating buried bit lines using a BSC process.

Referring to FIG. 2A, by etching a semiconductor substrate 21, for example, a silicon substrate, using hard mask patterns 22 as etch masks on the semiconductor substrate 21, a plurality of trenches 23 is defined. As a result, a plurality of semiconductor bodies 24 is formed to be separated by the plurality of trenches 23. The plurality of semiconductor bodies 24 has a structure that is substantially perpendicular from the semiconductor substrate 21 and may be linear. Accordingly, each of the plurality of semiconductor bodies 24 may have both sidewalls.

Passivation layers with etching selectivities are formed on the structure including the plurality of trenches 23. The passivation layers may be formed as a stacked layer in which a first passivation layer 25 and a second passivation layer 26 are stacked. For example, the first passivation layer 25 may be an oxide layer, and the second passivation layer 26 may be a nitride layer.

A first sacrificial layer 27 is formed on the second passivation layer 26 to partially fill the plurality of trenches 23. The first sacrificial layer 27 that partially fills the trenches 23, may be formed through a series of processes of forming the first sacrificial layer 27 on the entire surface of the semiconductor substrate 21 to fill the plurality of trenches 23, planarizing the upper surface of the first sacrificial layer 27 and then performing a blanket etching process, for example, etch-back. The first sacrificial layer 27 may be formed of a substance having an etching selectivity with respect to the first and second passivation layers 25 and 26. For example, the first sacrificial layer 27 may be a silicon layer.

Figure 2B:
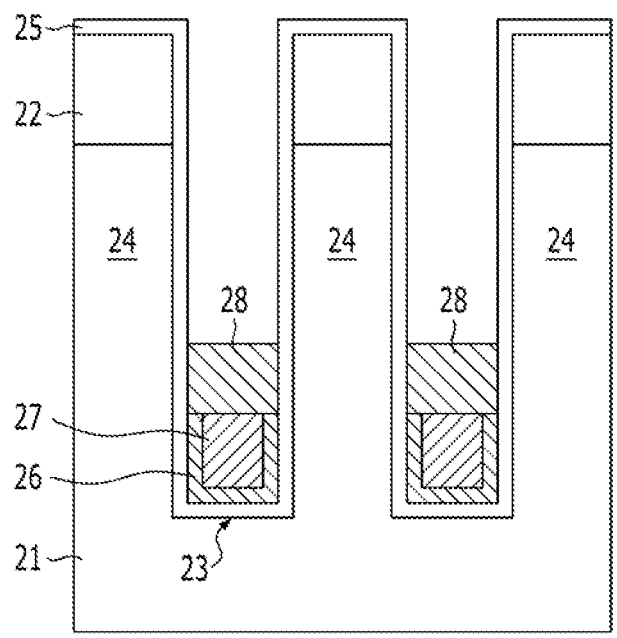

Referring to FIG. 2B, the portion of the second passivation layer 26, which is exposed by the first sacrificial layer 27, is selectively removed. As a result, the upper surface of the second passivation layer 26 may have the same level as that of the first sacrificial layer 27.

A second sacrificial layer 28 is formed on the first sacrificial layer 27 and the second passivation layer 26 to partially fill the plurality of trenches 23. The second sacrificial layer 28 may be formed through a series of processes of forming the second sacrificial layer 28 on the entire surface of the semiconductor substrate 21 to fill the plurality of trenches 23, planarizing the upper surface of the second sacrificial layer 28 and then performing a blanket etching process, for example, etch-back. The second sacrificial layer 28 may be a silicon layer.

Figure 2C:
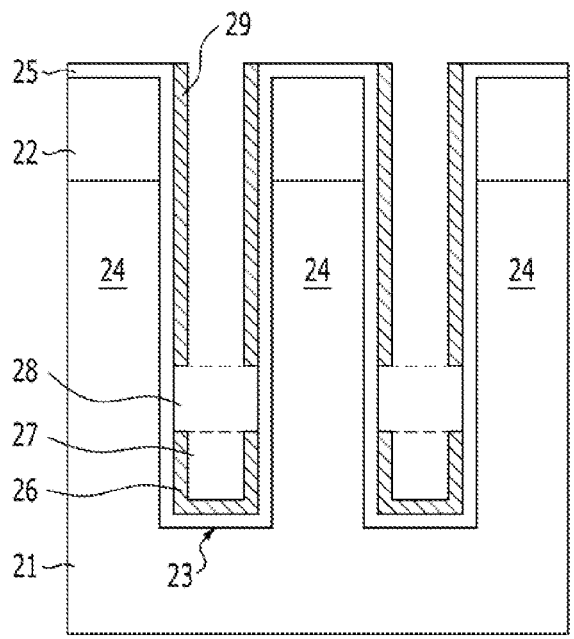

Referring to FIG. 2C after forming a third passivation layer 29 on the surface of the structure including the second sacrificial layer 28, by selectively etching the third passivation layer 29, the third passivation layer 29 remains in the form of spacers on the sidewalls of each of the plurality of trenches 23. The third passivation layer 29 may be a nitride layer.

The second sacrificial layer 28 is then removed. In this process, the first passivation layer 25, the second passivation layer 26 and the third passivation layer 29 may not be removed since they have etching selectivities with respect to the second sacrificial layer 28.

Subsequently, the first sacrificial layer 27 that is exposed due to the removal of the second sacrificial layer 28 is removed. In this process, the first passivation layer 25, the second passivation layer 26 and the third passivation layer 29 are not removed since they also have etching selectivities with respect to the first sacrificial layer 27.

Figure 2D:
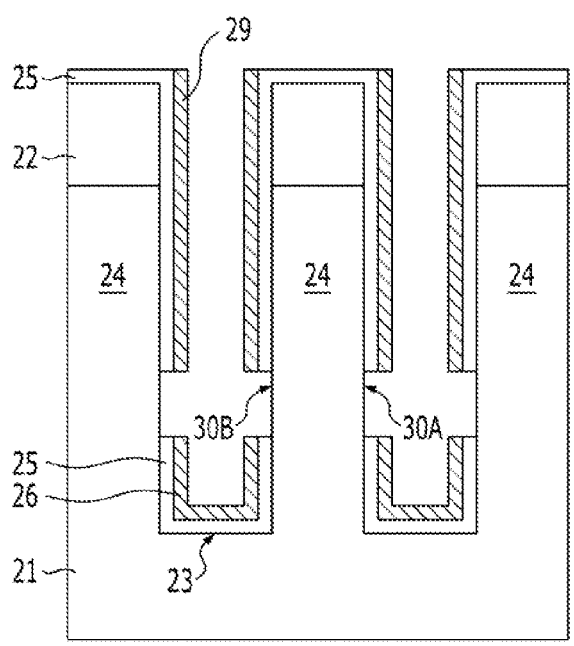

Referring to FIG. 2D, the portion of the first passivation layer 25, which is exposed by the second passivation layer 26 and the third passivation layer 29, is selectively removed. As a consequence, open parts 30A and 30B that partially open both sidewalls of the plurality of semiconductor bodies 24 are defined. The open parts 30A and 30B may be linear shapes that extend on the sidewalls of the plurality of semiconductor bodies 24.

The series of processes for forming the open parts 30A and 30B as described above are referred to as a BSC (both-side-contact) process. The BSC process is contrasted with the conventional OSC (one-side-contact) process. While the OSC process is a process for opening one of both sidewalls of each semiconductor body, the BSC process is a process for opening both sidewalls of each semiconductor body 24. Furthermore, unlike the OSC process, since the BSC process is simple and does not use tilt ion implantation and an OSC mask, its productivity and reproducibility are desirable.

Figure 2E:
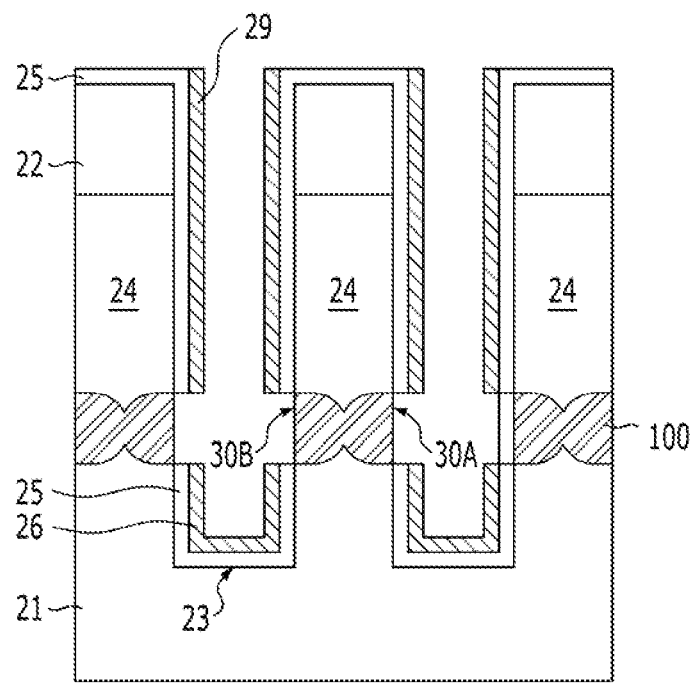

Referring to FIG. 2E, by performing annealing after forming a metal-containing layer (not shown) on the surface of the structure including the open parts 30A and 30B, a metal silicide layer 100 is formed in the portion of each of the plurality of semiconductor bodies 24, which is exposed through the open parts 30A and 30B. The metal silicide layer 100 has such a shape that is to be buried in each of the plurality of semiconductor bodies 24, and serves as a buried bit line (BBL). Hereinafter, the metal silicide layer 100 is referred to as the buried bit line 100.

While not shown, the remaining metal-containing layer is removed, and additional annealing for improving the characteristics of the buried bit lines 100 including a metal silicide may be performed.

Since the buried bit lines 100 formed through the above-described processing procedure have such shapes that are to be buried in the semiconductor bodies 24, the parasitic capacitance between adjacent buried bit lines 100 may be effectively reduced when compared to the conventional OSC structure. Moreover, as a metal silicide is adopted as the material of the buried bit lines 100, the sheet resistance (Rs) of the buried bit lines 100 may be reduced.

However, the buried bit lines 100 formed through the above-described BSC process is encountered with a concern in that, as the metal silicide agglomerates due to a thermal process performed after the process for forming the buried bit lines 100, the buried bit lines 100 with linear shapes are likely to break. Also, as the buried bit lines 100 abnormally diffuse due to the agglomeration of the metal silicide, the semiconductor bodies 24 are likely to lean, or the process margin of structures (for example, vertical channel transistors) to be formed in the semiconductor bodies 24 may be decreased.

Moreover, in the above-described BSC process, a variation may occur in a position for defining the open parts 30A and 30B due to process variables. In other words, even when process conditions are precisely controlled, it may not be possible to uniformly define the open parts 30A and 30B at the same position. As a consequence, the above concerns occurring due to the agglomeration of the metal silicide may become serious.

Hereinbelow, an embodiment of the present invention provides a semiconductor structure that includes barrier layers containing a substance (for example, germanium) for preventing agglomeration of a metal silicide, adjacent to the metal silicide in vertical structures having buried conductors including a metal silicide. The embodiment of the present invention will be explained assuming that the buried conductors and the vertical structures are buried bit lines and semiconductor bodies, respectively. In other words, buried bit lines that include metal silicide formed through a BSC process to decrease the parasitic capacitance between adjacent buried bit lines and reduce the sheet resistance of the buried bit lines and that are prevented from breaking due to the agglomeration of the metal silicide, and a method for fabricating the same will be described below in detail with reference to FIGS. 3 and 4A to 4L.

Figure 3:
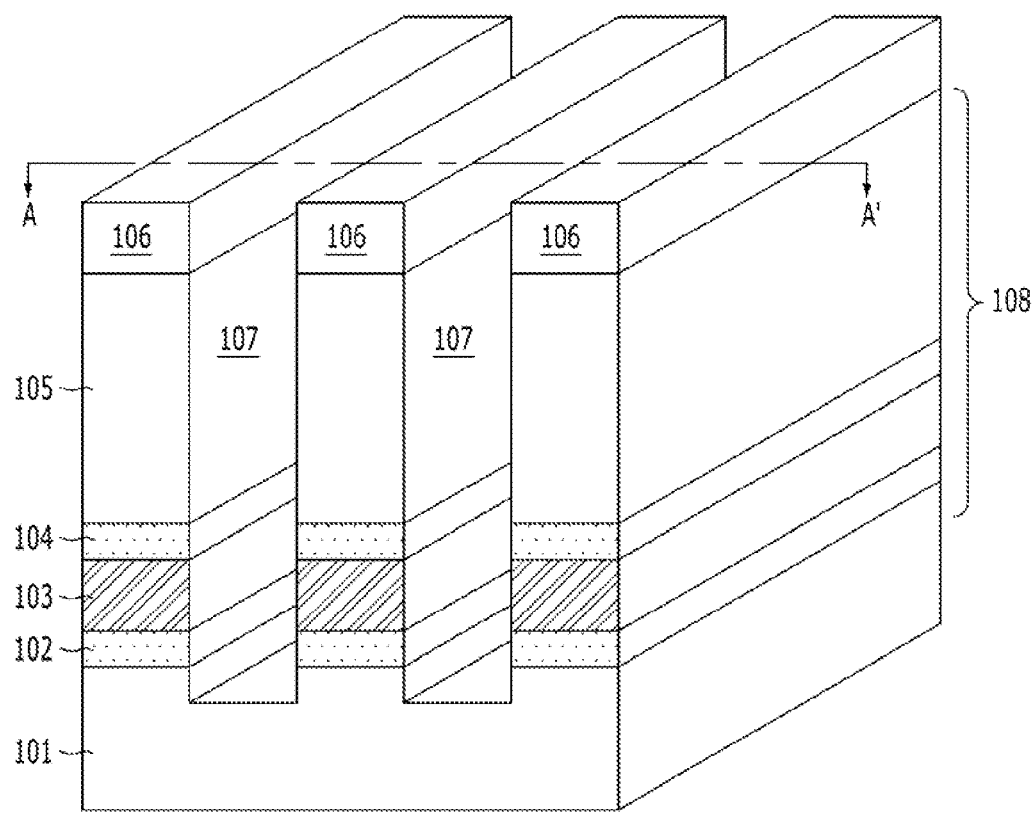
FIG. 3 is a perspective view illustrating buried bit lines in accordance with an embodiment of the present invention.

FIG. 3 is a perspective view illustrating buried bit lines in accordance with an embodiment of the present invention.

Referring to FIG. 3, semiconductor bodies 108 are vertically formed on a semiconductor substrate 101, and buried bit lines 103 including a metal silicide are formed in the semiconductor bodies 108. Barrier layers containing germanium are respectively formed on and beneath the buried bit lines 103.

The semiconductor substrate 101 may have a monocrystalline state. Furthermore, the semiconductor substrate 101 may include a silicon-containing material. Accordingly, the semiconductor substrate 101 may include a monocrystalline silicon-containing material. In detail, the semiconductor substrate 101 may include a silicon substrate or an SOI (silicon-on insulator) substrate.

The semiconductor bodies 108 formed substantially perpendicular from the semiconductor substrate 101 may be formed as stack structures in which the semiconductor substrate 101, a first barrier layer 102, the buried bit lines 103, a second barrier layer 104 and a semiconductor layer 105 are sequentially stacked. Trenches 107 are defined between the semiconductor bodies 108. Adjacent semiconductor bodies 108 are separated from one another by the trenches 107. The trenches 107 may be defined using hard mask patterns 106 that are formed on the semiconductor layer 105. The semiconductor bodies 108 separated by the trenches 107 may have linear shapes that extend in one direction. Accordingly, each of the semiconductor bodies 108 may have both sidewalls that face adjacent semiconductor bodies 108.

The first barrier layer 102 and the second barrier layer 104 respectively formed beneath and on the buried bit lines 103 function to prevent the agglomeration of the buried bit lines 103 including the metal silicide. Therefore, the first barrier layer 102 and the second barrier layer 104 contain a material that may prevent the agglomeration of the metal silicide. In detail, the first barrier layer 102 and the second barrier layer 104 may be barrier layers containing germanium (Ge). For instance, the first barrier layer 102 and the second barrier layer 104 may be silicon germanium (Site). In order to effectively prevent the agglomeration of the metal silicide by germanium, the content of germanium in the first barrier layer 102 and the content of germanium in the second barrier layer 104, separately, may be at least approximately 30%. Although detailed explanations will be made later when describing a method for fabricating the buried bit lines 103, the first barrier layer 102 and the second barrier layer 104 may have a monocrystalline state, formed through an epitaxial growth method.

The buried bit lines 103 positioned between the first barrier layer 102 and the second barrier layer 104 may have linear shapes that extend in the same direction as the semiconductor bodies 108. The buried bit lines 103 include the metal silicide. Since the metal silicide is a material of which resistance is lower than that of (poly)silicon doped with a dopant, the buried bit lines 103 have low resistance. The buried bit lines 103 may be formed through a silicidation process. Further, the buried bit lines 103 may be formed through a full silicidation process. The full silicidation process is a process for fully silicidating a silicon-containing material. The buried bit lines 103 may be formed of a near-noble metal such as a titanium silicide ($TiSi_x$) a tungsten silicide ($WSi_x$), a cobalt silicide ($CoSi_x$) and a nickel silicide ($NiSi_x$) or a metal silicide such as a refractory metal. The metal silicide may be obtained by forming a metal-containing layer through a sputtering process, a chemical vapor deposition (CVD) process or an atomic layer deposition (ALD) process and then performing a silicidation process. The metal-containing layer may include a near-noble metal or a refractory metal.

The semiconductor layer 105 positioned on the second barrier layer 104 may have a monocrystalline state. The semiconductor layer 105 may include a silicon-containing material. Accordingly, the semiconductor layer 105 may include a monocrystalline silicon-containing material. In detail, the semiconductor layer 105 may be a monocrystalline silicon layer that is formed through epitaxial growth. The semiconductor layer 105 may be a structure that is formed on the buried bit lines 103, for example, a structure for forming semiconductor pillars including the channel regions of vertical channel transistors.

Since the buried bit lines 103 according to the embodiment of the present invention, having the above-described structure, are positioned between the first barrier layer 102 and the second barrier layer 104 that contain a material for preventing the agglomeration of the metal silicide, a concern likely to be caused due to the agglomeration of the metal silicide may be resolved. In detail, the buried bit lines 103 may be prevented from breaking due to the agglomeration of the metal silicide. Furthermore, the abnormal diffusion of the buried bit lines 103 due to the agglomeration of the metal silicide is prevented. As a consequence, the semiconductor bodies 108 may be prevented from leaning, or the processing margin of structures (for example, semiconductor pillars) formed on the buried bit lines 103 may be prevented from decreasing.

Besides, since the buried bit lines 103 according to the embodiment of the present invention is positioned between the first barrier layer 102 and the second barrier layer 104, even though open parts are not uniformly defined at the same position to each other while forming the buried bit line 103 using a BSC process, the buried bit lines 103 may be uniformly formed at the same position as adjacent buried bit lines. Thus, the processing margin of a process for defining the open parts may be increased, and even though the open parts are not uniformly defined at the same position due to process variables, a concern likely to be caused due to the agglomeration of the metal silicide may be resolved. Detailed explanations for the method for fabricating the buried bit line 103 will be described below.

FIGS. 4A to 4L are cross-sectional views illustrating the processes of a method for fabricating buried bit lines in accordance with an embodiment of the present invention. Herein, a method for fabricating buried bit lines having the structure shown ire FIG. 3 will be exemplarily described. FIGS. 4A to 4L are taken along the line A-A' of FIG. 3.

Figure 4A:
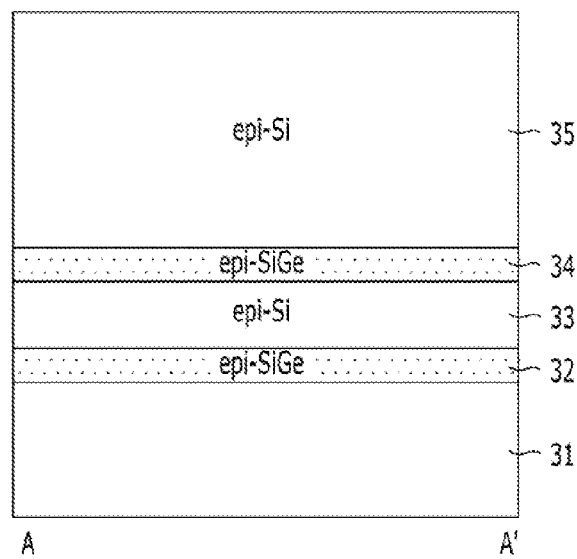
FIGS. 4A to 4L are cross-sectional views illustrating a method for fabricating buried bit lines in accordance with an embodiment of the present invention.

Referring to FIG. 4A, a semiconductor substrate 31 is prepared. The semiconductor substrate 31 may have a monocrystalline state and may include a silicon-containing material. That is to say, the semiconductor substrate 31 may include a monocrystalline silicon-containing material. For example, as the semiconductor substrate 31, a silicon substrate or an SOI (silicon-on-insulator) substrate may be used.

A first barrier layer 32, a first semiconductor layer 33, a second barrier layer 34 and a second semiconductor layer 35 are sequentially formed on the semiconductor substrate 31. All of the first barrier layer 32, the first semiconductor layer 33, the second barrier layer 34 and the second semiconductor layer 35 may have a monocrystalline state. Accordingly, the first barrier layer 32, the first semiconductor layer 33, the second barrier layer 34 and the second semiconductor layer 35 may be formed through an epitaxial growth method. In order to sequentially grow the first barrier layer 32, the first semiconductor layer 33, the second barrier layer 34 and the second semiconductor layer 35 that have a monocrystalline state, on the semiconductor substrate 31 including the silicon-containing material, all of the layers may include a silicon-containing material.

The first barrier layer 32 and the second barrier layer 34 function to prevent a metal silicide from being formed on the semiconductor substrate 31 and the second semiconductor layer 35 while subsequently converting the first semiconductor layer 33 into a metal silicide layer (that is, buried bit line) and prevent the agglomeration of the metal silicide. For this purpose, the first barrier layer 32 and the second barrier layer 34 include a material that prevents the silicidation of the silicon-containing material and the agglomeration of the metal silicide. The material for preventing the agglomeration of the metal silicide may be germanium (Ge). Accordingly, the first barrier layer 32 and the second barrier layer 34 may be formed of a silicon-containing material doped with germanium, for example, as a silicon germanium (SiGe) layer. In order to effectively prevent the agglomeration of the metal silicide, the content (concentration) of germanium in silicon germanium may be at least approximately 30%.

The first semiconductor layer 33 positioned between the first barrier layer 32 and the second barrier layer 34 is a region where a metal silicide layer (that is, buried bit line) is to be formed through a subsequent process, and functions to provide a silicon source in a silicidation reaction. For instance, the first barrier layer 32 may be formed as a silicon layer that has a monocrystalline state.

The second semiconductor layer 35 on the second barrier layer 34 may be used to form vertical channel transistors through a subsequent process. For example, vertical channel transistors may include source regions, drain regions and channel regions. The channel regions of the vertical channel transistors may be positioned in the second semiconductor layer 35. For instance, the second barrier layer 34 may be formed as a silicon layer that has a monocrystalline state.

Figure 4B:
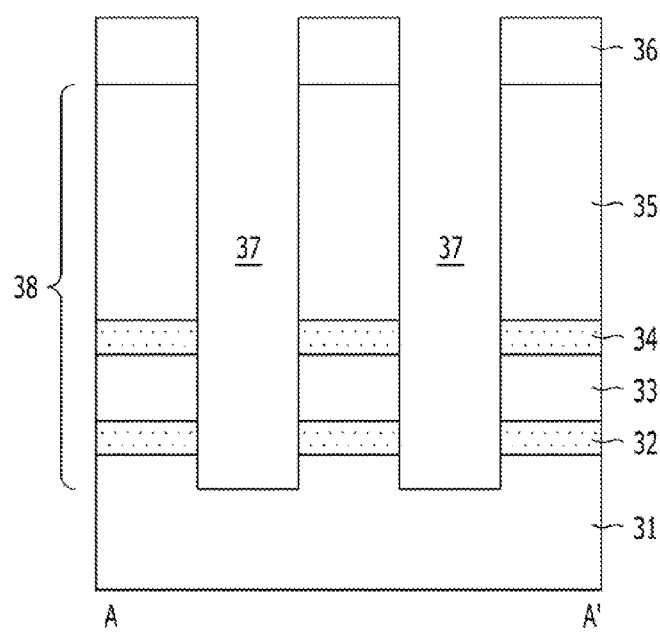

Referring to FIG. 4B, hard mask patterns 36 are formed on the second semiconductor layer 35. The hard mask patterns 36 may be formed as any one single layer selected from the group including an oxide layer, a nitride layer, an oxynitride layer, a carbon-containing layer and a semiconductor layer, and a stack layer thereof. For example, the hard mask patterns 36 may be formed as a stack layer in which a hard mask nitride layer and a hard mask oxide layer are sequentially stacked. Alternatively, the hard mask patterns 36 may be formed as a stack layer in which a hard mask nitride layer, a hard mask oxide layer, a hard mask silicon oxynitride layer and a hard mask carbon layer are sequentially stacked. The hard mask patterns 36 may be formed using photoresist patterns (not shown). The hard mask patterns 36 are to form a plurality of semiconductor bodies 38. Through a subsequent process, the plurality of semiconductor bodies 38 may be used to form vertical channel transistors that have buried bit lines. The vertical channel transistors have increased degree of integration and improved operation characteristics, and accordingly, may be applied to the memory cells of a semiconductor memory device.

The second semiconductor layer 35, the second barrier layer 34, the first semiconductor layer 33 and the first barrier layer 32 are etched using the hard mask patterns 36 as each masks, and in succession, the semiconductor substrate 31 is partially etched, by which trenches 37 are defined. An etching process for defining the trenches 37 may include anisotropic etching. When the second semiconductor layer 35, the second barrier layer 34, the first semiconductor layer 33 and the first barrier layer 32 include a silicon-containing material, anisotropic etching may be performed using a chlorine-based gas such as $Cl_2$ and $CCl_4$, a bromide-based gas such as HBr, or a mixed gas of $O_2$ gas.

The plurality of semiconductor bodies 38 is formed in such a way as to be separated by the trenches 37 that are defined through the above-described processes. The plurality of semiconductor bodies 38 may be stack structures in which the semiconductor substrate 31, the first barrier layer 32, the first semiconductor layer 33, the second barrier layer 34 and the second semiconductor layer 35 are stacked substantially perpendicular to the semiconductor substrate 31. The plurality of semiconductor bodies 38 may have linear shapes that extend in one direction. Therefore, each of the plurality of semiconductor bodies 38 may have both sidewalk that face adjacent semiconductor bodies 38.

Figure 4C:
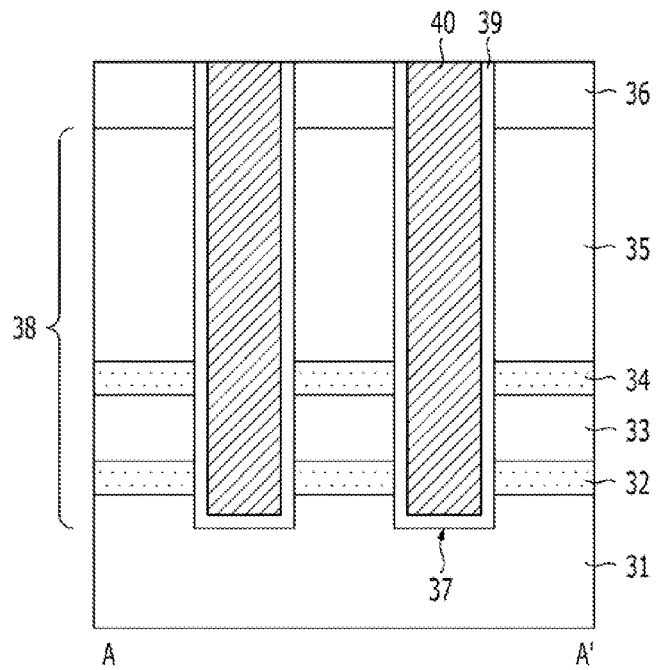

Referring to FIG. 4C, a first passivation layer 39 is formed on the surface of the structure including the trenches 37. The first passivation layer 39 may be formed as any one selected from the group including a dielectric layer including an oxide layer, a nitride layer, and so forth, a semiconductor layer including a silicon layer, and so forth, a metal layer including titanium (Ti), cobalt (Co) aluminum (Al), and so forth, and a mixture thereof (for example, a metal nitride layer). For instance, the first passivation layer 39 may be formed as a silicon oxide ($SiO_2$) layer.

A sacrificial layer 40 is formed on the first passivation layer 39 to gapfill the trenches 37. The sacrificial layer 40 that fills the trenches 37 may be formed through a series of processing procedures of depositing the sacrificial layer 40 on the entire surface of the semiconductor substrate 31 to fill the trenches 37 and then performing a planarization process until the hard mask patterns 36 are exposed. The planarization process may be performed using chemical mechanical polishing (CMP). While performing the planarization process the first passivation layer 39 on the hard mask patterns 36 may also be removed.

The sacrificial layer 40 is formed of a material that has an etching selectivity with respect to the first passivation layer 39. The sacrificial layer 40 may be formed as any one selected from the group including a dielectric layer including an oxide layer, a nitride layer, and so forth, a semiconductor layer including a silicon layer, and so forth, a metal layer including titanium (Ti), cobalt (Co) aluminum (Al) and so forth, and a mixture thereof (for example, a metal nitride layer). For instance, when the first passivation layer 39 is formed as a silicon oxide layer, the sacrificial layer 40 may be formed as a polysilicon (poly-Si) layer.

Figure 4D:
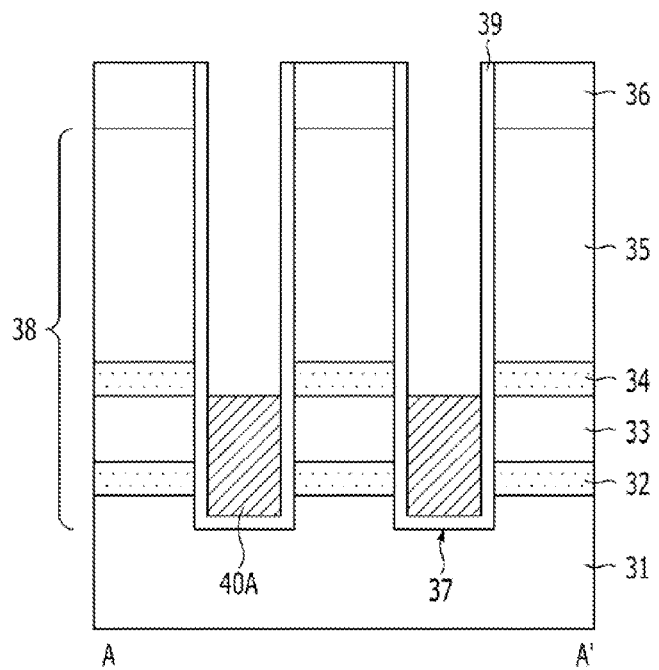

Referring to FIG. 4D, by performing primary recess etching for the sacrificial layer 40, the thickness of the sacrificial layer 40 is decreased. The primary recess etching may be performed using a blanket etching method, for example, etch-back. Hereinafter, the sacrificial layer 40 with a decreased thickness will be designated by the reference numeral 40A.

By the primary recess etching, the sacrificial layer 40A has such a shape that is to be filled in the lower portions of the trenches 37. The upper surface of the sacrificial layer 40A is positioned between the upper surface of the second barrier layer 34 and the lower surface of the second barrier layer 34. The upper surface of the second barrier layer 34 means the interface between the second barrier layer 34 and the second semiconductor layer 35 and the lower surface of the second barrier layer 34 means the interface between the second barrier layer 34 and the first semiconductor layer 33.

Figure 4E:
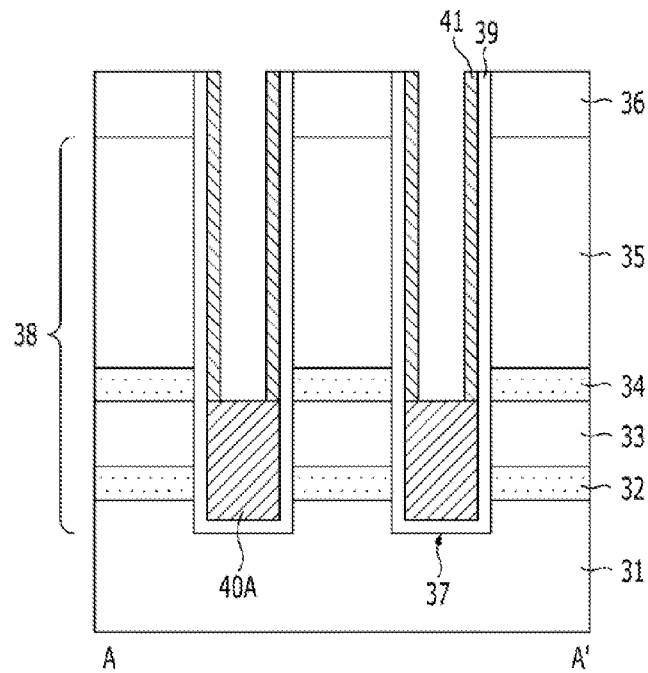

Referring to FIG. 4E, after forming a second passivation layer 41 on the surface of the structure including the sacrificial layer 40A, spacer etching is performed so that the second passivation layer 41 remains on the semiconductor bodies 38 and the hard mask patterns 36. The spacer etching may be performed using a blanket etching method, for example, etch-back.

The second passivation layer 41 is formed of a material that has an etching selectivity with respect to the first passivation layer 39 and the sacrificial layer 40A. The second passivation layer 41 may be formed as one selected from the group including a dielectric layer including an oxide layer, a nitride layer, and so forth, a semiconductor layer including a silicon layer, and so forth, a metal layer including titanium (Ti) cobalt (Co) aluminum (Al) and so forth, and a mixture thereof (for example, a metal nitride layer). For instance, when the first passivation layer 39 and the sacrificial layer 40 are formed as a silicon oxide layer and a polysilicon layer, respectively, the second passivation layer 41 may be formed as a silicon nitride ($Si_3N_4$) layer.

Figure 4F:
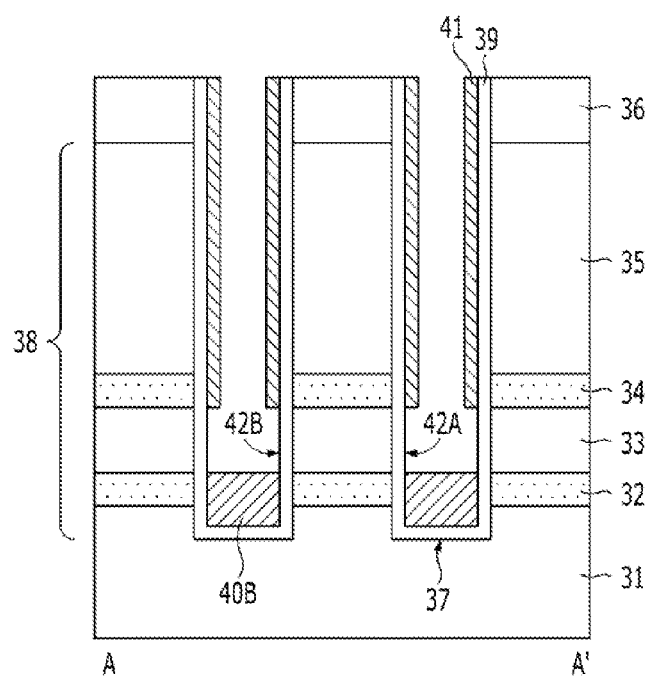

Referring to FIG. 4F, by performing a secondary recess etching for the sacrificial layer 40A, the thickness of the sacrificial layer 40A is decreased. The secondary recess etching may be performed using a blanket etching method, for example, etch-back. Hereinafter, the sacrificial layer 40A with a decreased thickness will be designated by the reference numeral 40B.

By the secondary recess etching, the sacrificial layer 40B has such a shape that is to be filled in the lower portions of the trenches 37. The upper surface of the sacrificial layer 40B is positioned between the upper surface of the first barrier layer 32 and the lower surface of the first barrier layer 32. The upper surface of the first barrier layer 32 means the interface between the first barrier layer 32 and the first semiconductor layer 33, and the lower surface of the first barrier layer 32 means the interface between the first barrier layer 32 and the semiconductor substrate 31.

Through the above-described processing procedure, preliminary open parts 42A and 42B may be defined to expose the first passivation layer 39 on the sidewalls of the first semiconductor layer 33 where a metal silicide layer (that is, buried bit line) is to be formed. The preliminary open parts 42A and 42B are opened in linear shapes that extend along the sidewalls of the plurality of semiconductor bodies 38. In particular, the preliminary open parts 42A and 42B are simultaneously opened on both sidewalls of the plurality of semiconductor bodies 38.

Figure 4G:
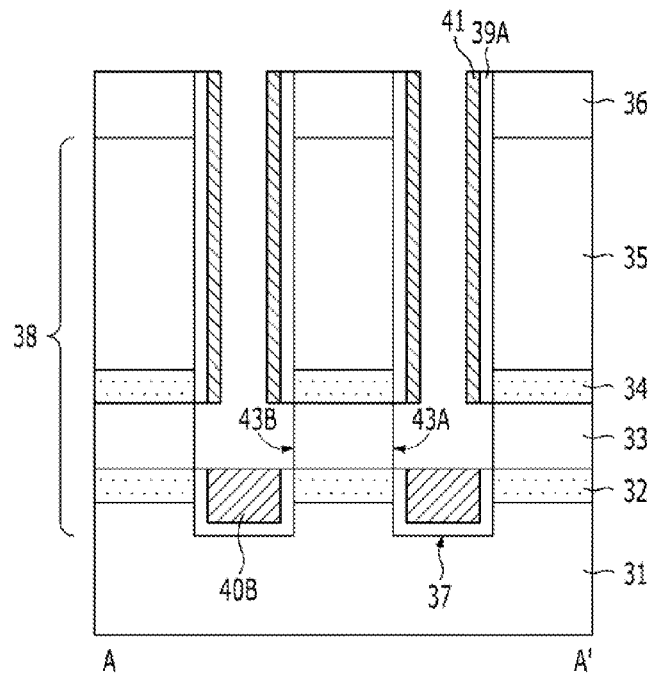

Referring to FIG. 4G, portions of the first passivation layer 39 that are exposed through the preliminary open parts 42A and 42B are removed. Hereinafter, the first passivation layer 39 will be designated by the reference numeral 39A.

By this fact, as the portions of the first passivation layer 39A, which are exposed through the preliminary open parts 42A and 42B, are removed, open parts 43A and 43B are defined in such a way as to expose the sidewalls of the first semiconductor layer 33. The open parts 43A and 43B are opened in linear shapes that extend along the sidewalls of the plurality of semiconductor bodies 38. The open parts 43A and 43B are simultaneously opened on both sidewalls of the plurality of semiconductor bodies 38. The sidewalls of the plurality of semiconductor bodies 38 on which the open parts 43A and 43B are defined are covered by the first passivation layer 39A, the second passivation layer 41 and the sacrificial layer 40B. When viewed from the open parts 43A and 43B, the lower sidewalls of the plurality of semiconductor bodies 38 are covered by the first passivation layer 39A and the sacrificial layer 40$_5$, and the upper sidewalls of the plurality of semiconductor bodies 38 are covered by the first passivation layer 39A and the second passivation layer 41.

Figure 4H:
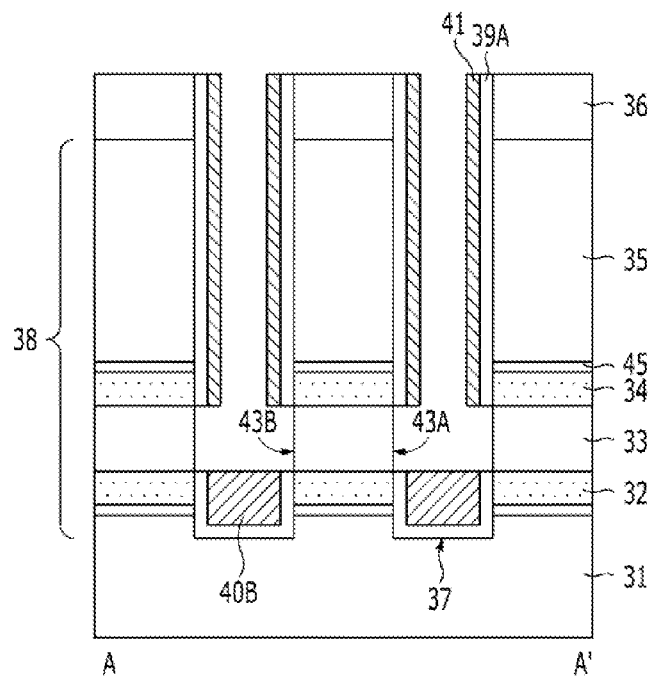

Referring to FIG. 4H, a plasma doping is performed. As a dopant is doped into portions of both sidewalls of the plurality of semiconductor bodies 38, which are exposed through the open parts 43A and 43B, first source/drain regions 45 are formed. The first source/drain regions 45 serve as the source regions or the drain regions of vertical channel transistors.

The first source/drain regions 45 may be formed in the first semiconductor layer 33 or may be formed in the first semiconductor layer 33, the first barrier layer 32 and the second barrier layer 34. Furthermore, as shown in the drawing of FIG. 4H, the first source/drain regions 45 may be formed not only in the first semiconductor layer 33, the first barrier layer 32 and the second barrier layer 34, but also in the semiconductor substrate 31 and the second semiconductor layer 35. This depends on the degree of diffusion of the dopant that is implanted during plasma doping and may be controlled according to characteristics requested for a semiconductor device.

The plasma doping is a method where a doping source (that is, the dopant) is excited to a plasma state and dopant ions in the excited plasma are implanted into a target object. By supplying a bias voltage to the target object, the dopant ions in the plasma may be doped all at once to the entire surface of the target object. Here, the bias energy is also referred to as doping energy.

The plasma doping is performed using doping energy, a doping dose and a doping source. The doping source is a material that contains a dopant to be doped to the first source/drain regions 45. The doping source includes a dopant gas. The doping source uses a dopant gas containing arsenic (As), phosphorus (P), and so forth. For example, the doping source includes $AsH_3$ or $PH_3$. Arsenic (As) and phosphorus (P) are known as N-type dopants. Also, as the doping source, a dopant gas containing boron (B) may be used. Boron is known as a P-type dopant. The doping energy is a bias voltage supplied to the semiconductor substrate 31. As the doping energy is also applied to the semiconductor bodies 38, a lateral plasma doping is possible. Furthermore, the lateral plasma doping is possible even by the bombardment of ions in excited plasma. The doping dose indicates an implantation amount of the dopant. The doping dose is set to from approximately $1 \times 10^{15}$ atoms/cm$^2$ to approximately $1 \times 10^{17}$ atoms/cm$^2$. By performing the plasma doping using the doping dose with such a range, the dopant doped to the first source/drain regions 45 has a doping concentration equal to or greater than approximately $1 \times 10^{20}$ atoms/cm$^3$. For the plasma doping, a gas for exciting plasma may be flowed. The gas for exciting plasma includes argon (Ar), helium (He), etc.

According to the above descriptions, since the plasma doping does not need a tilt angle, doping is possible without experiencing a shadow effect by a surrounding structure. Due to this fact, the first source/drain regions 45 may be formed at desired positions.

Moreover, the first source/drain regions 45 may be simultaneously formed in both open parts 43A and 43B by controlling the doping energy. Therefore, the first source/drain regions 45 simultaneously formed in both open parts 43A and 43B are connected with each other and may serve as one region.

As another method for forming the first source/drain regions 45, doped polysilicon in situ doped with a dopant may be used. For example, by performing annealing after filling the doped polysilicon into the trenches 37, dopant in the doped polysilicon may be diffused into the plurality of semiconductor bodies 38.

Figure 4I:
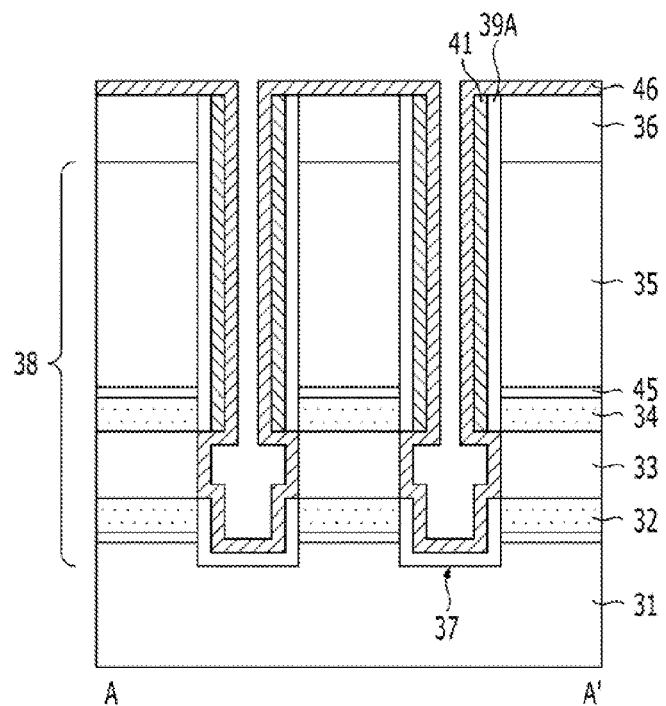
Figure 4J:
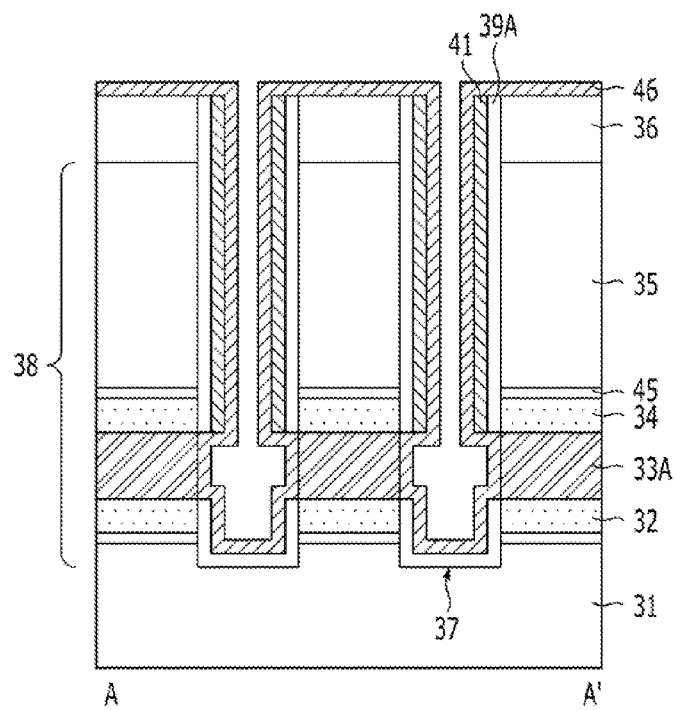

Referring to FIG. 4I, after removing the sacrificial layer 40B, a metal-containing layer 46 is formed on the entire surface of a structure including the first source/drain regions 45. The metal-containing layer 46 includes a metal-containing material that may perform a silicidation. For example, the metal-containing layer 46 may include one selected among cobalt (Co), titanium (Ti), tantalum (Ta), nickel (Ni), tungsten (W), platinum (Pt) and palladium (Pd). The metal-containing layer 46 may be formed through chemical vapor deposition (CVD) or atomic layer deposition (ALD).

Referring to FIG. 43, the silicidation is performed through annealing, so that the metal-containing layer 46 and the plurality of semiconductor bodies 38, that is, the first semiconductor layer 33, react with each other. Because the material of the first semiconductor layer 33 contains silicon, a metal silicide layer 33A is formed by the reaction of the metal-containing layer 46 and the first semiconductor layer 33. The metal silicide layer 33A may include any one selected among a cobalt silicide, a titanium silicide, a tantalum silicide, a nickel silicide, a tungsten silicide, a platinum silicide and a palladium silicide.

The annealing for forming the metal silicide layer 33A may be a rapid thermal annealing (RTA). The rapid thermal annealing may be performed at different temperatures depending upon the kinds (or materials) of the first semiconductor layer 33 and the metal-containing layer 46. For example, when the metal-containing layer 46 is formed of cobalt (Co) an annealing temperature range may be from approximately 400° C. to approximately 800° C. The metal silicide layer 33A may be formed to have a fully silicidated (FUSI) structure. In other words/by sufficiently performing silicidation from the sidewalls of the first semiconductor layer 33, the first semiconductor layer 33 is fully silicidated. Through the full silicidation, the metal silicide layer 33A is formed in each of the plurality of semiconductor bodies 38.

In this way, the metal silicide layer 33A, which is formed through the silicidation process in such a shape that is to be buried in each of the plurality of semiconductor bodies 38, becomes a buried bit line (BBL). Hereinafter, the metal silicide layer 33A will be referred to as the buried bit line 33A.

In the silicidation process for forming the buried bit line 33A including metal silicide, since the first barrier layer 32 and the second barrier layer 34 include the material for preventing the silicidation of silicon-containing material, that is, germanium, metal silicide is neither formed in the first barrier layer 32 nor formed in the second barrier layer 34. Therefore, metal silicide is neither formed in the semiconductor substrate 31 lying beneath the first barrier layer 32 nor formed in the second semiconductor layer 35 lying on the second barrier layer 34.

Figure 4K:
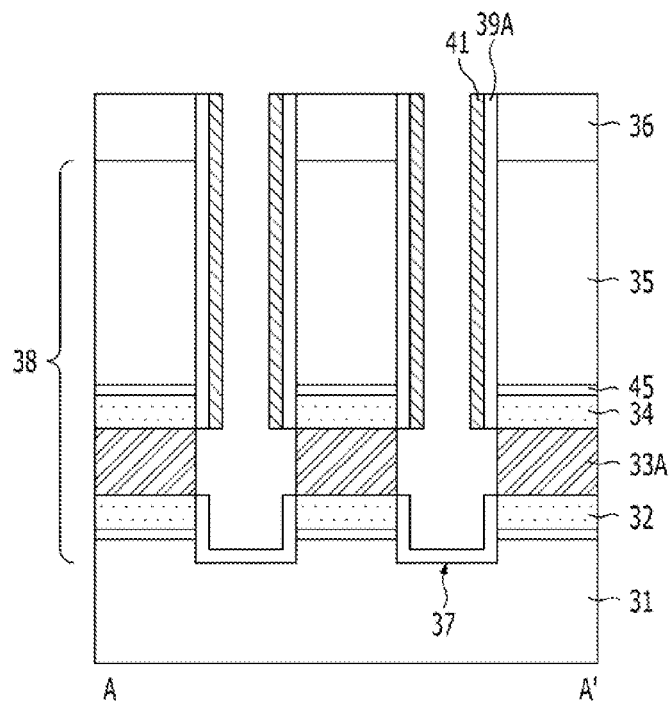

Referring to FIG. 4K, the non-reacted portion of the metal-containing layer 46, which remains after forming the metal silicide layer 33A, is removed. The non-reacted portion of the metal-containing layer 46 may be removed through wet etching.

Meanwhile, when the metal-containing layer 46 is formed of cobalt to form cobalt silicide, a rapid thermal annealing (RTA) may be performed at least twice. For example, a primary annealing and a secondary annealing are performed. The primary annealing is performed at a temperature in the range from approximately 400° C. to approximately 600° C., and the secondary annealing is performed at a temperature in the range from approximately 600° C. to approximately 800° C. By the primary annealing, a cobalt silicide with the phase of $CoSi_x$ (x=0.1~1.5) is formed. By the secondary annealing, a cobalt silicide with the phase of $CoSi_2$ is obtained. The cobalt silicide with the phase of $CoSi_2$ has the smallest specific resistance. Non-reacted cobalt is removed between the primary annealing and the secondary annealing. The non-reacted cobalt may be removed by using a mixture of a sulphuric acid ($H_2SO_4$) and a hydrogen peroxide ($H_2O_2$).

Figure 4L:
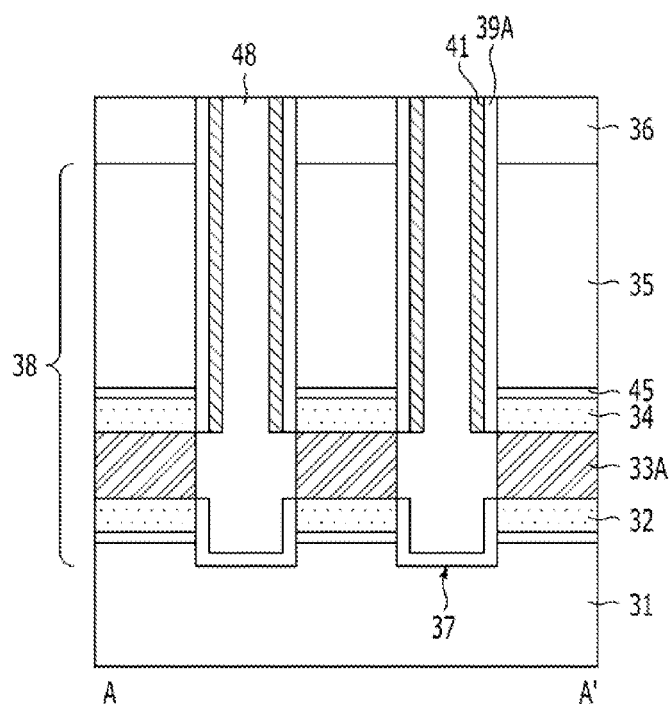

Referring to FIG. 4L, an interlayer dielectric layer 48 is formed to gapfill the trenches 37. The interlayer dielectric layer 48 may include an oxide such as BPSG (boron phosphorus silicate glass). After forming the interlayer dielectric layer 48, planarization may be performed so that the surfaces of the hard mask patterns 36 are exposed.

Through the above-described processing procedures, the buried bit lines 33A according to the embodiment of the present invention may be formed. Since the buried bit lines 33A according to the embodiment of the present invention are formed by fully silicidating the first semiconductor layer 33, which is positioned between the first barrier layer 32 and the second barrier layer 34 that contain the material for preventing the agglomeration of the metal silicide, a metal silicide may be prevented from being formed in a subsequent process. In particular, in a thermal process to be performed after the process for forming the buried bit lines 33A, it is possible to prevent a metal silicide from being formed by the first barrier layer 32 and the second barrier layer 34. Through this, a concern likely to be caused due to the agglomeration of the metal silicide may be solved. In detail, the buried bit lines 33A with the linear shapes are prevented from breaking, and the abnormal diffusion of the buried bit lines 33A is prevented, whereby it is possible to prevent the semiconductor bodies 38 from leaning and process margins from decreasing.

In addition, because the buried bit lines 33A are formed by silicidating the first semiconductor layer 33 positioned between the first barrier layer 32 and the second barrier layer 34, even when a variation occurs in a position for defining the open parts 43A and 43B, the buried bit lines 33A may be uniformly formed at the same position. That is to say, a variation in the position of the open parts 43A and 43B occurred due to process variables may be compensated for by the first barrier layer 32 and the second barrier layer 34. Thus, the concern likely to be caused due to the agglomeration of the metal silicide may be prevented from being serious because the open parts 43A and 43B are not uniformly defined at the same position.

Figure 5A:
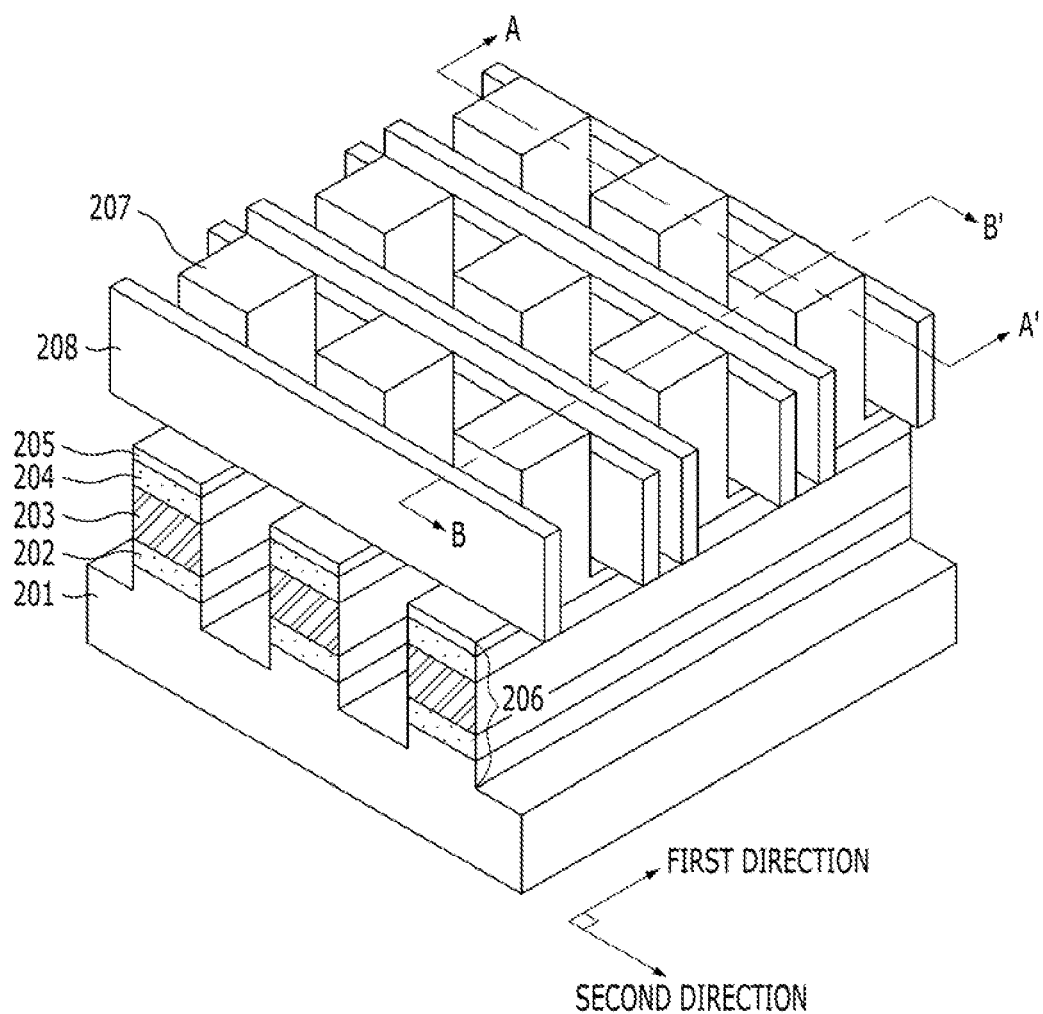
FIGS. 5A to 5C are views illustrating a semiconductor device having buried bit lines in accordance with an embodiment of the present invention.
Figure 5B:
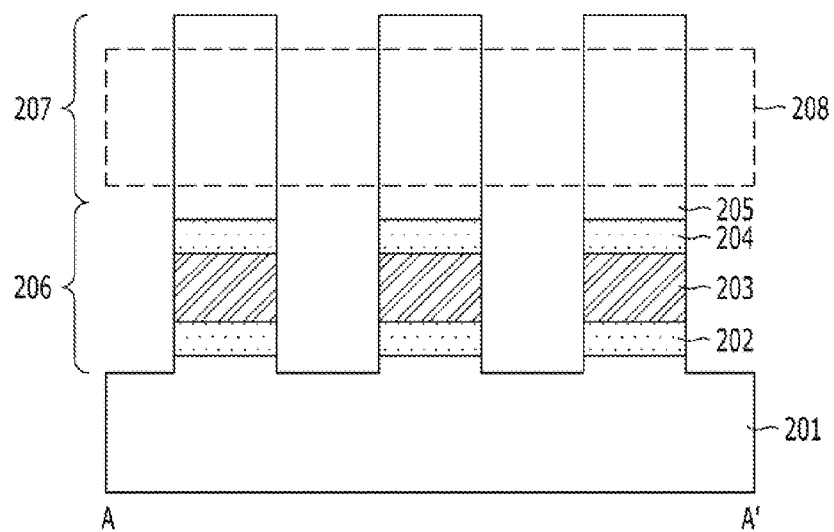
Figure 5C:
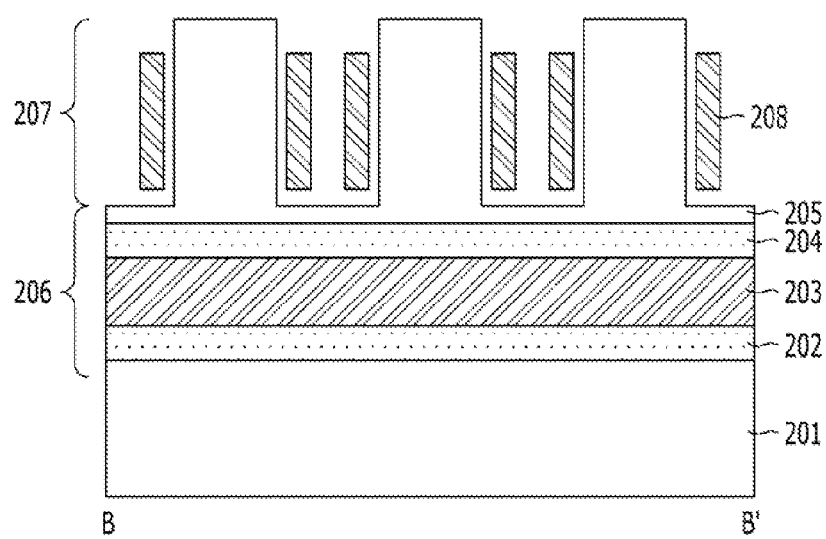

FIGS. 5A to 5C are views illustrating a semiconductor device having buried bit lines in accordance with an embodiment of the present invention. More specifically, FIG. 5A is a perspective view. FIG. 5B is a cross-sectional view taken along the line A-A' of FIG. 5A. FIG. 5C is a cross-sectional view taken along the line B-B' of FIG. 5A.

Referring to FIGS. 5A to 5C, semiconductor bodies 206 are formed substantially perpendicular to a semiconductor substrate 201, and semiconductor pillars 207 are formed substantially perpendicular to the semiconductor bodies 206. Buried bit lines 203 including a metal silicide are formed in the semiconductor bodies 206, and barrier layers containing germanium are respectively formed on and beneath the buried bit lines 203. The semiconductor bodies 206 and the semiconductor pillars 207 are active structures.

The semiconductor substrate 201 may have a monocrystalline state. Furthermore, the semiconductor substrate 201 may include a silicon-containing material. Accordingly, the semiconductor substrate 201 may include a monocrystalline silicon-containing material. In detail, the semiconductor substrate 201 may include a silicon substrate or an SOI (silicon-on insulator) substrate.

The semiconductor bodies 206 formed substantially perpendicular to the semiconductor substrate 201 may be stack structures in which the semiconductor substrate 201, a first barrier layer 202, the buried bit lines 203, a second barrier layer 204 and a semiconductor layer 205 are sequentially stacked. Trenches (see the reference numeral 107 of FIG. 3) are defined between the semiconductor bodies 206. Adjacent semiconductor bodies 206 are separated from one another by the trenches. The semiconductor bodies 206 separated by the trenches may have linear shapes that extend in a first direction. Accordingly, each of the semiconductor bodies 206 may have both sidewalls that face adjacent semiconductor bodies 206.

The first barrier layer 202 and the second barrier layer 204, which are respectively formed beneath and on the buried bit lines 203, function to prevent the agglomeration of the buried bit lines 203 including the metal silicide. Therefore, the first barrier layer 202 and the second barrier layer 204 contain a material that may prevent the agglomeration of the metal silicide. In detail, the first barrier layer 202 and the second barrier layer 204 may be barrier layers containing germanium (Ge). For instance, the first barrier layer 202 and the second barrier layer 204 may be silicon germanium (Site). In order to effectively prevent the agglomeration of the metal silicide by germanium, the content of germanium in the first barrier layer 202 and the content of germanium in the second barrier layer 204, separately, may be at least approximately 30%. The first barrier layer 202 and the second barrier layer 204 may have a monocrystalline state, formed through an epitaxial growth method.

The buried bit lines 203 positioned between the first barrier layer 202 and the second barrier layer 204 may have linear shapes that extend in the same direction as the semiconductor bodies 206. The buried bit lines 203 include the metal silicide. Since the metal silicide is a material of which resistance is lower than that of (poly)silicon doped with a dopant, the buried bit lines 203 have low resistance. The buried bit lines 203 may be formed of a near-noble metal such as a titanium silicide ($TiSi_x$), a tungsten silicide ($WSi_x$), a cobalt silicide ($CoSi_x$) and a nickel silicide ($NiSi_x$) or a metal silicide such as a refractory metal.

The semiconductor layer 205 positioned on the second barrier layer 204 may have a monocrystalline state. The semiconductor layer 205 may include a silicon-containing material. Accordingly, the semiconductor layer 205 may include a monocrystalline silicon-containing material. In detail, the semiconductor layer 205 may be a monocrystalline silicon layer that is formed through epitaxial growth.

A plurality of semiconductor pillars 207 is formed on each semiconductor body 206. The plurality of semiconductor pillars 207 that is formed on the semiconductor bodies 206 may be formed by etching the semiconductor layer 205. The plurality of semiconductor pillars 207 are vertically formed on the semiconductor bodies 206. For example, the semiconductor substrate 201 and the semiconductor bodies 206 may be orthogonal to each other, and the semiconductor bodies 206 and the plurality of semiconductor pillars 207 may be orthogonal to each other. The plurality of semiconductor pillars 207 are formed on the semiconductor bodies 206 to be separated from one another. In detail the plurality of semiconductor pillars 207 may have a matrix type array layout.

Each semiconductor pillar 207 has a structure in which the source/drain regions and the channel region of a vertical channel transistor are formed. For example, each semiconductor pillar 207 may include a first source/drain region, a second source/drain region and a vertical channel region. Any one of the first source/drain region and the second source/drain region may be connected with each buried bit line 203. The other of the first source/drain region and the second source/drain region may be connected with a storage (not shown). The first source/drain region and the second source/drain region may form an NPN junction or a PNP junction with the vertical channel region. For example, when the first source/drain region and the second source/drain region are doped with impurities of a first conductivity type, the vertical channel region may be doped with impurities of a second conductivity type opposite to the first conductivity type. When the impurities of the first conductivity type are N type impurities, the impurities of the second conductivity type include P type impurities. On the other hand, when the impurities of the first conductivity type are P type impurities, the impurities of the second conductivity type include N type impurities. In the event that the vertical channel transistor is an NMOSFET, the first source/drain region, the vertical channel region and the second source/drain region may form an NPN junction.

Word lines 208 are formed on the sidewalls of the plurality of semiconductor pillars 207 to be disposed vertically. Thus, the word lines 208 are referred to as vertical word lines. Since the word lines 208 are formed on both sidewalls of the plurality of semiconductor pillars 207, a double word line structure may be formed. Even though the double word line structure is formed, ends of the respective word lines 208 may be connected with each other. Since the plurality of semiconductor pillars 207 include channel regions, vertical channels are formed by the word lines 208. By these facts vertical channel transistors each including a first source/drain region, a vertical channel region and a second source/drain region are formed. The word lines 208 may extend in a second direction, which is perpendicular to the first direction (the extending direction of the buried bit lines 203). The word lines 208 include a metallic material. For example, the word lines 208 may include a titanium nitride (TiN) or the stack (WN/W) of a tungsten nitride and tungsten. The word lines 208 and the buried bit lines 203 may be formed to be separated from each other. To this end, a dielectric material may be additionally formed between the word lines 208 and the buried bit lines 203. The dielectric material may include a silicon oxide, etc.

Moreover, while not shown in the drawings, the semiconductor device in accordance with the embodiment of the present invention may include storages that are formed on and connected to the plurality of semiconductor pillars 207. The storages may store logic information in a semiconductor memory device. For example, when the semiconductor device in accordance with the embodiment of the present invention is applied to the memory cells of a DRAM the storages may be capacitors. Also, when the semiconductor device in accordance with the embodiment of the present invention is applied to a phase change RAM (PRAM), the storages may include a phase change material such as chalcogenide. Furthermore, when the semiconductor device in accordance with the embodiment of the present invention is applied to a resistive RAM (ReRAM), the storages may include a resistance variable material such as a transition metal oxide. Further, when the semiconductor device in accordance with the embodiment of the present invention is applied to a magnetic RAM (MRAM or STTRAM), the storages may include magnetic tunnel junctions (MTJ).

Figure 6A:
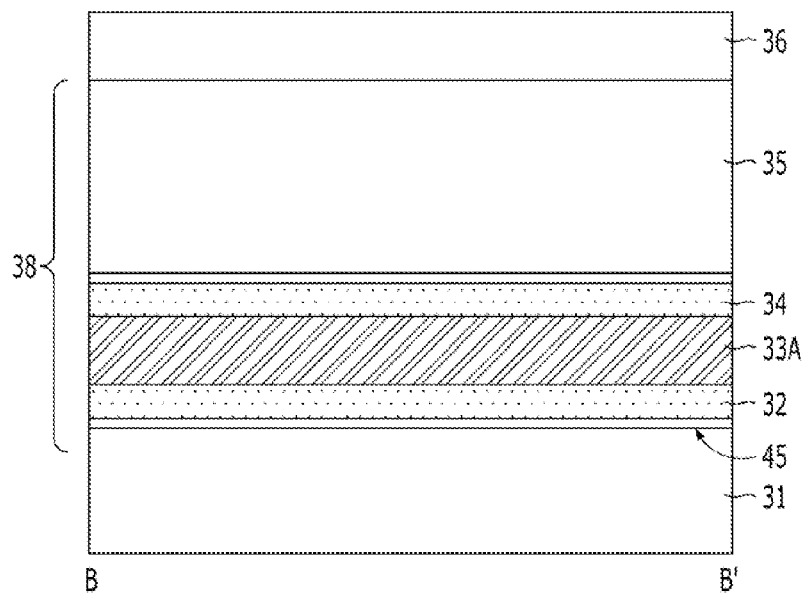
FIGS. 6A to 6F are cross-sectional views illustrating a method for fabricating a semiconductor device with buried bit lines in accordance with an embodiment of the present invention.

FIGS. 6A to 6F are cross-sectional views illustrating the processes of a method for fabricating a semiconductor device having buried bit lines in accordance with an embodiment of the present invention. Herein, the method for fabricating a semiconductor device having buried bit lines will be exemplarily described in succession to the method for fabricating buried bit lines shown in FIGS. 4A to 4L. FIGS. 6A to 6F are cross-sectional views taken along the line B-B' of FIG. 5A. FIG. 6A is a cross-sectional view taken along the line B-B' of FIG. 5A for the structure shown in FIG. 4L.

Referring to FIG. 6A, the buried bit lines 33A are formed through the BSC process to extend in the one direction. The first barrier layer 32 and the second barrier layer 34 are respectively formed beneath and on the buried bit lines 33A. The buried bit lines 33A may be formed in the first source/drain regions 45 that are formed in the semiconductor bodies 38.

Figure 6B:
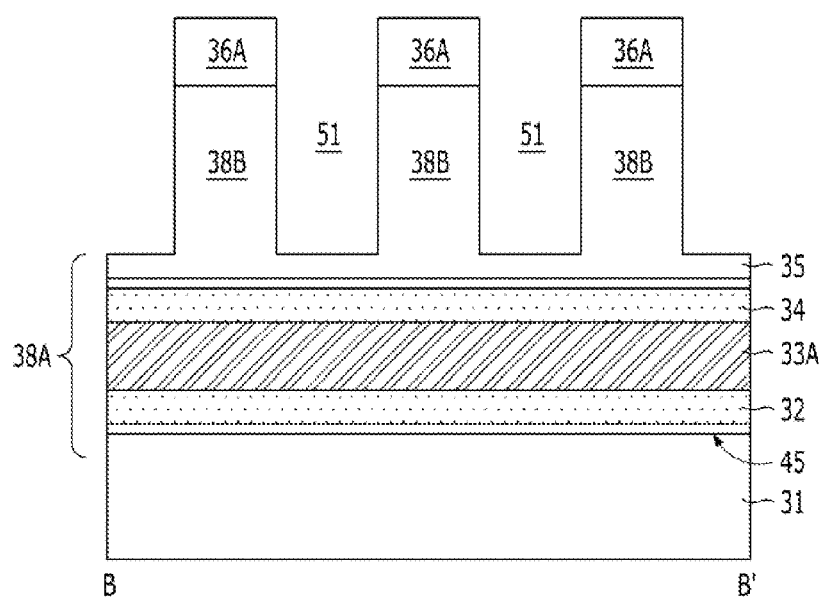

Referring to FIG. 6B, word line trenches 51 are defined. Photoresist patterns (not illustrated) are used to define the word line trenches 51. The hard mask patterns 36 are etched using the photoresist pattern as etch masks. Successively, the upper portions of the semiconductor bodies 38 are etched by a predefined depth. While not shown in the cross-sectional view taken along the line B-B' of FIG. 5A, the interlayer dielectric layer 48 (see FIG. 4L) may be etched by the predefined depth as well. Hereinbelow, the etched hard mask patterns 36 and semiconductor bodies 38 will be respectively referred by the reference numerals 36A and 38A.

By etching the upper portions of the semiconductor bodies 38 in this way, a plurality of semiconductor pillars 38B are formed on semiconductor bodies 38A. The semiconductor bodies 38A and the semiconductor pillars 38B become active structures. The semiconductor bodies 38A are separated by the trenches 37 and have linear shapes that extend in the same direction as the buried bit lines 33A. The semiconductor pillars 38B have structures that are substantially perpendicular to the semiconductor bodies 38A and are formed by etching the second semiconductor layer 35. The semiconductor pillars 38B may be formed by the unit of cell. Accordingly, a plurality of semiconductor pillars 38B are formed on one semiconductor body 38A and are separated from one another by the word line trenches 51. The depth of the word line trenches 51 may have a dimension that does not expose the buried bit lines 33A. In detail, the word line trenches 51 may have a depth that does not expose the second barrier layer 34.

The semiconductor pillars 38B have structures in which the source drain regions and the channel regions of vertical channel transistors are formed. The plurality of semiconductor pillars 38B may have the layout of a matrix type array on the semiconductor bodies 38A.

For reference, in the embodiment of the present invention, since the abnormal diffusion of the buried bit lines 33A constituted by the metal silicide is prevented by the first barrier layer 32 and the second barrier layer 34, the process margins of the semiconductor pillars 38B and structures to be formed in the semiconductor pillars 38B may be secured.

Figure 6C:
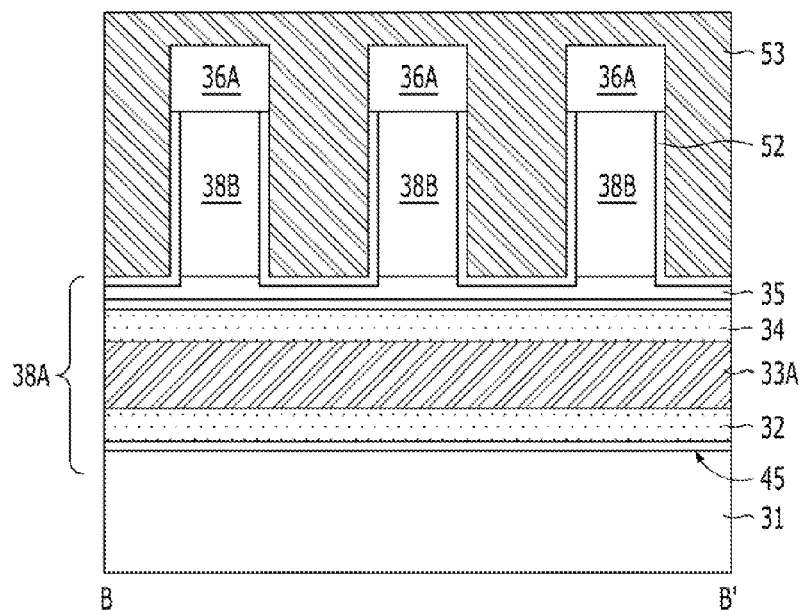

Referring to FIG. 6C, a gate dielectric layer 52 is formed on the surfaces of the semiconductor bodies 38A and the semiconductor pillars 38B that are exposed. The gate dielectric layer 52 may be formed by oxidating the sidewalls of the semiconductor pillars 38B and the upper surfaces of the semiconductor bodies 38A. The oxidation process may be performed using thermal oxidation.

A conductive layer 53 is formed on the entire surface to fill the word line trenches 51. The conductive layer 53 may use a low resistance material. For example, a metallic layer may be used. The metallic layer means a conductive layer including a metal, and may include a titanium layer, a titanium nitride layer, a tungsten layer, and so forth.

Figure 6D:
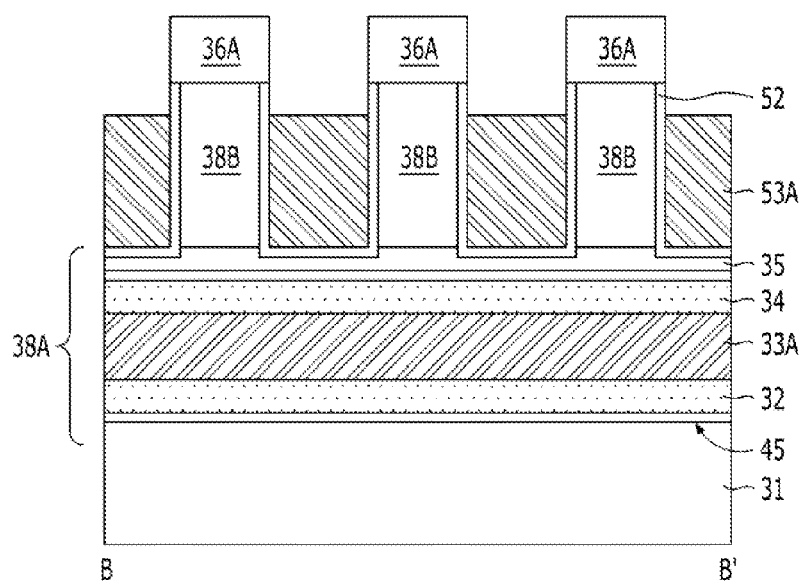

Referring to FIG. 6D, a planarization and a blanket etching (for example, etch-back) are sequentially performed for the conductive layer 53. The planarization process may be performed using chemical mechanical polishing (CMP). The planarization process may be performed until the hard mask patterns 36A are exposed. The blanket etching is performed after the planarization. In the blanket etching, an etching amount for the conductive layer 53 may be controlled according to a predetermined channel length. Hereinbelow, the etched conductive layer 53 will be designated by the reference numeral 53A.

Figure 6E:
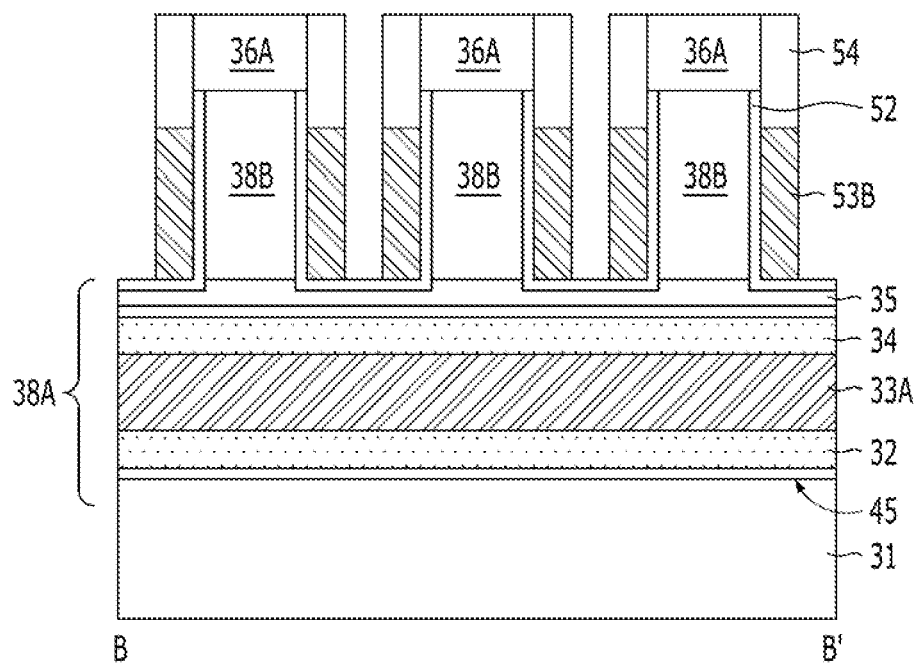

Referring to FIG. 6E, by depositing a dielectric layer on the surface of the structure including the conductive layer 53A and then performing blanket etching (for example, etch-back), spacers 54 are formed. The spacers 54 may include an oxide layer, a nitride layer or an oxynitride layer. In an exemplary embodiment, the spacers 54 may be formed as a nitride layer.

The conductive layer 53A is etched using the spacers 54 as etch masks. According to this fact, vertical word lines 53B are formed on both sidewalls of the semiconductor pillars 38B. The vertical word lines 53B also serve as vertical gate electrodes. In a variation for the vertical word lines 53B, the vertical word lines 53B may be formed to surround the semiconductor pillars 38B. In another variation, after forming annular vertical gate electrodes surrounding the semiconductor pillars 38B, vertical word lines 53B may be formed in such a way as to connect adjacent vertical gate electrodes with each other. The vertical word lines 53B may be formed to extend in a direction crossing with the buried bit lines 33A.

Figure 6F:
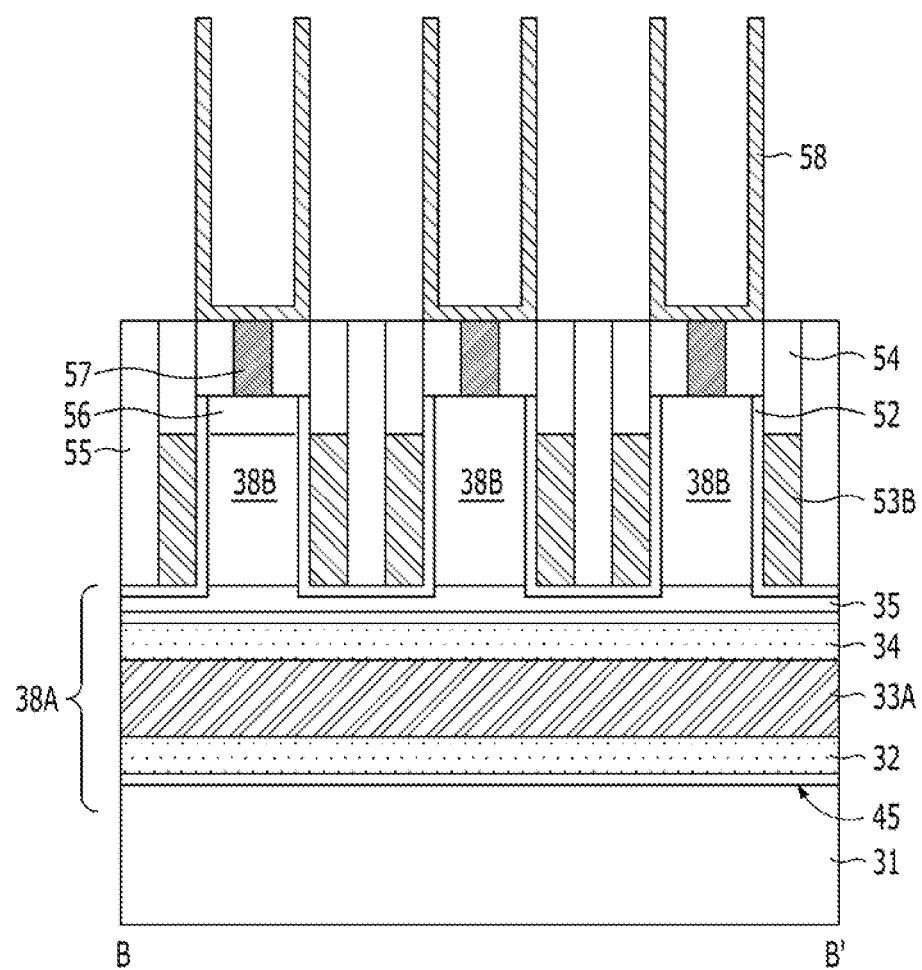

Referring to FIG. 6F, a word line isolation layer 55 for isolating the vertical word lines 53B from one another is formed. The word line isolation layer 55 includes a dielectric layer. The word line isolation layer 55 may be formed by forming a dielectric layer on the entire structure formed with the vertical word lines 53B and then performing planarization until the hard mask patterns 36A are exposed.

By performing storage node contact etching, the upper surfaces of the semiconductor pillars 38B are exposed. Thereafter, storage node contact (SNC) plugs 57 are formed. Before forming the storage node contact plugs 57, second source/drain regions 56 may be formed in the upper portions of the semiconductor pillars 38B by performing an ion implantation. The second source/drain regions 56 may be formed by adopting the ion implantation method generally known in the art. Accordingly, the semiconductor pillars 38B may include the second source/drain regions 56 and channel regions. The channel regions are formed between the first source/drain regions 45 and the second source/drain regions 56. The second source/drain regions 56 may be connected with capacitors. The first source/drain regions 45, the channel regions and the second source/drain regions 56 may be connected with one another in the vertical direction. The first source/drain regions 45 and the second source/drain regions 56 may form NPN junctions or PNP junctions in cooperation with the channel regions. For example, when the first source/drain regions 45 and the second source/drain regions 56 are doped with impurities of a first conductivity type, the channel regions may be doped with impurities of a second conductivity type opposite to the first conductivity type. When the impurities of the first conductivity type are N type impurities, the impurities of the second conductivity type include P type impurities. Conversely, when the impurities of the first conductivity type are P type impurities, the impurities of the second conductivity type include N type impurities. When the vertical channel transistors are NMOSFETs the first source/drain regions 45, the channel regions and the second source/drain regions 56 may form NPN junctions.

Storages are formed on the storage node contact plugs 57. The storages indicate means for storing logic information in a semiconductor memory device, and may include capacitors. The capacitors include storage nodes 58. The storage nodes 58 may have the shapes of cylinders. In another embodiment, the storage nodes 58 may have the shapes of pillars or concaves. While not shown in a drawing, a dielectric layer and top electrodes are subsequently formed.

A semiconductor device having the buried bit lines 33A may be formed through the above-described processing procedure. While descriptions were made up to a method for forming vertical channel transistors with the buried bit lines 33A and capacitors, the semiconductor device may be completed by performing subsequent processes for forming metal lines, etc. according to a method generally known in the art.

Figure 7:
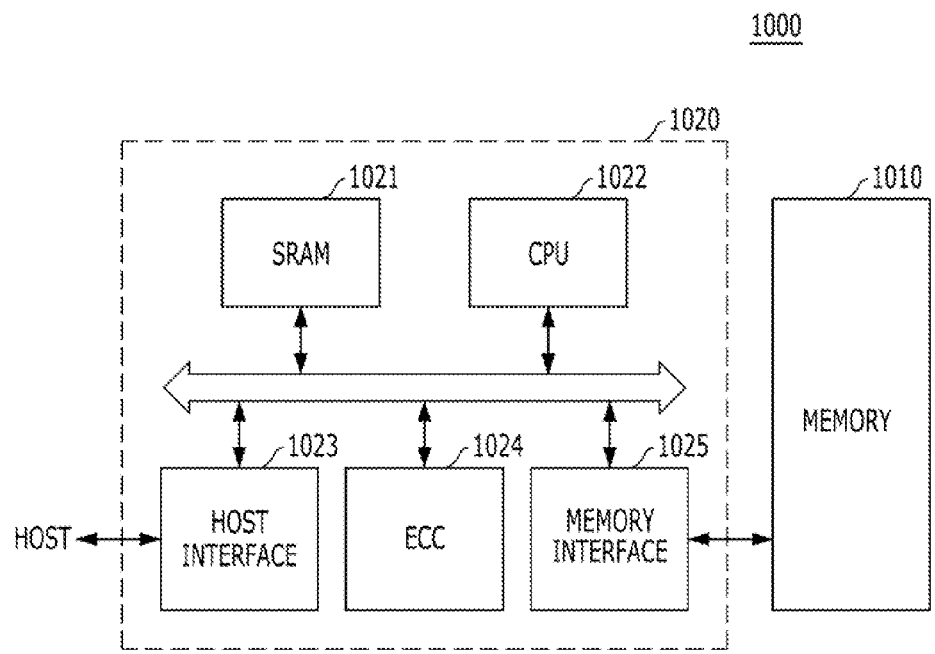
FIG. 7 is a block diagram illustrating a memory card including the semiconductor device according to the embodiments of the present invention.

FIG. 7 is a block diagram illustrating a memory card including the semiconductor device according to the embodiments of the present invention.

Referring to FIG. 7, the semiconductor device having buried bit lines according to the embodiments of the present invention may be applied to a memory card 1000. For instance, the memory card 1000 may include a memory controller 1020 that controls general data exchange between a host HOST and a semiconductor memory 1010. The memory controller 1020 may include a SRAM 1021, a central processing unit (CPU) 1022, a host interface 1023, an error correction code (ECC) 1024, and a memory interface 1025. The SRAM 1021 may be used as an operating memory of the central processing unit 1022. The host interface 1023 may include the data exchange protocol of the host that is connected with the memory card 1000. The error correction code 1024 may detect and correct an error that is included in the data read out from the semiconductor memory 1010. The memory interface 1025 interfaces with the semiconductor memory 1010. The central processing unit 1022 performs general control operations for the data exchange of the memory controller 2020.

As the semiconductor memory 1010 applied to the memory card 1000 includes the semiconductor device having buried bit lines in accordance with the embodiments of the present invention, the parasitic capacitance between adjacent buried bit lines may be decreased so that signal transfer characteristics may be improved, and the buried bit lines are prevented from breaking so that the characteristics and the reliability of the semiconductor device may be improved.

As the semiconductor memory 1010 applied to the memory card 1000 includes the semiconductor device having buried bit lines in accordance with the embodiments of the present invention, buried bit lines having linear shapes may be prevented from breaking due to agglomeration of a metal silicide. Furthermore, as abnormal diffusion of the buried bit lines is prevented, leaning of semiconductor bodies may be prevented and the process margins of semiconductor pillars and vertical channel transistors including the same may be secured. Moreover, since the buried bit lines are positioned between a first barrier layer and a second barrier layer, even though open parts are not uniformly defined at the same position while performing a process for forming the buried bit lines using a BSC process, the buried bit lines may be uniformly formed at the same position.

Figure 8:
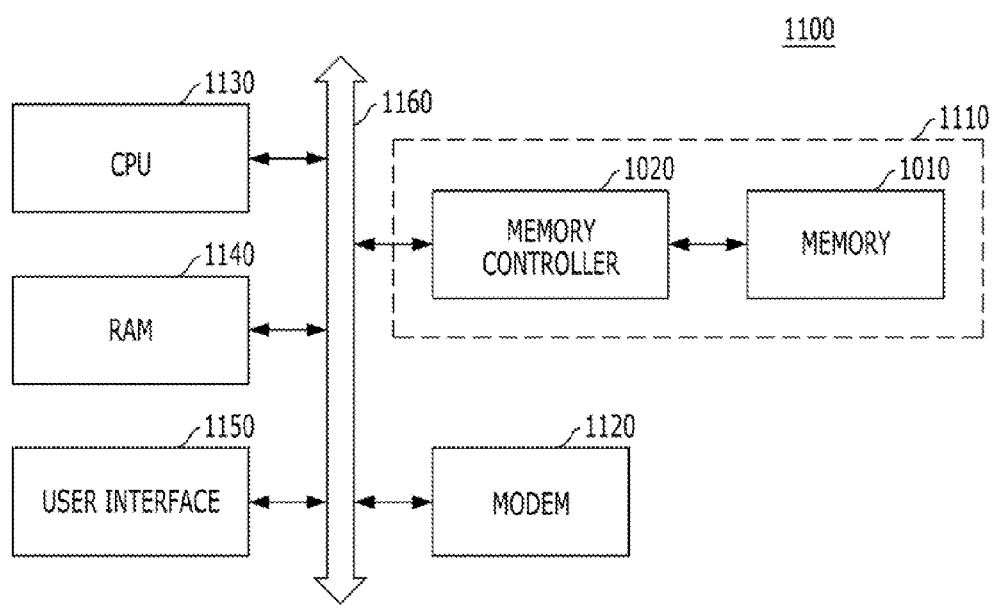
FIG. 8 is a block diagram schematically illustrating an exemplary electronic system including the semiconductor device according to the embodiments of the present invention.

FIG. 8 is a block diagram schematically illustrating an exemplary electronic system including the semiconductor device according to the embodiments of the present invention.

Referring to FIG. 8, an electronic system 1100 including the semiconductor device according to the embodiments of the present invention may include a memory system 1110, and a modem 1120, a central processing unit 1130, a RAM 1140 and a user interface 1150 that are connected to a system bus 1160. The data processed by the central processing unit 1130 or the data inputted from an outside may be stored in the memory system 1110. The memory system 1110 may include a memory 1010 and a memory controller 1020 and may be configured in substantially the same way as the memory card 1000 described above with reference to FIG. 7.

The electronic system 1100 may be provided as a personal digital assistant (PDA), a portable computer, a web tablet, a wireless phone, a mobile phone, a digital music player, a memory card, electronic products capable of transmitting and/or receiving information under wireless circumstances, a solid state disk, a camera image processor, an application chipset, and so forth.

As is apparent from the above descriptions, according to the various embodiments, since barrier layers, which are formed over and under buried bit lines including a metal silicide and include a material (for example, germanium) for preventing agglomeration of the metal silicide is provided, the buried bit lines with linear shapes may be prevented from breaking due to the agglomeration of the metal silicide. Furthermore, as abnormal diffusion of the buried bit lines is prevented, leaning of semiconductor bodies may be prevented and the process margins of semiconductor pillars and vertical channel transistors including the same may be secured.

Moreover, since the buried bit lines are positioned between a first barrier layer and a second barrier layer, even though open parts are not uniformly defined at the same position while performing a process for forming the buried bit lines using a BSC process, the buried bit lines may be uniformly formed at the same position.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
   semiconductor bodies formed as stack structures of a semiconductor substrate, buried bit lines, and barrier layers,
   wherein each of the buried bit lines includes a metal silicide and is buried in the semiconductor bodies; and
   wherein the barrier layers containing germanium are formed under and over the buried bit line.

2. The semiconductor device according to claim 1, wherein each of the barrier layers comprises silicon germanium.

3. The semiconductor device according to claim 2, wherein a content of germanium in each of the barrier layers is at least approximately 30%.

4. The semiconductor device according to claim 1, wherein the metal silicide comprises a cobalt silicide.

5. The semiconductor device according to claim 1, further comprising:
   semiconductor pillars formed over the semiconductor bodies and including channel regions of vertical channel transistors; and
   storages connected to upper portions of the semiconductor pillars.

* * * * *